US012599041B2

(12) United States Patent
Lin et al.

(10) Patent No.: US 12,599,041 B2
(45) Date of Patent: Apr. 7, 2026

(54) COMMUNICATION DEVICE AND MANUFACTURING METHOD THEREOF

(71) Applicant: Innolux Corporation, Miaoli County (TW)

(72) Inventors: Jia-Sin Lin, Miaoli County (TW); Wen-Chi Fang, Miaoli County (TW); Jen-Hai Chi, Miaoli County (TW); Zhi-Fu Huang, Miaoli County (TW); Pei-Chi Chen, Miaoli County (TW); Wan-Chun Tsai, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 396 days.

(21) Appl. No.: 17/989,682

(22) Filed: Nov. 18, 2022

(65) Prior Publication Data

US 2023/0178534 A1 Jun. 8, 2023

Related U.S. Application Data

(60) Provisional application No. 63/286,102, filed on Dec. 6, 2021.

(30) Foreign Application Priority Data

Aug. 26, 2022 (CN) .......................... 202211033785.3

(51) Int. Cl.
H01L 25/18 (2023.01)
H01L 25/00 (2006.01)
(Continued)

(52) U.S. Cl.
CPC .............. H01L 25/18 (2013.01); H01L 25/50 (2013.01); H10D 1/64 (2025.01);
(Continued)

(58) Field of Classification Search
CPC ......... H01L 25/18; H01L 25/50; H01L 21/78; H01L 25/0655; H01L 21/6836;
(Continued)

(56) References Cited

U.S. PATENT DOCUMENTS

2011/0032685 A1* 2/2011 Akiba ...................... H01L 23/66
361/783
2013/0292825 A1* 11/2013 Huang .................... H01L 21/78
257/737

(Continued)

FOREIGN PATENT DOCUMENTS

CN 112505971 3/2021
KR 20180041590 * 4/2018 ........... H01L 25/167
(Continued)

OTHER PUBLICATIONS

"Office Action of Taiwan Counterpart Application", issued on Sep. 21, 2023, pp. 1-5.

(Continued)

*Primary Examiner* — Jeff W Natalini
*Assistant Examiner* — Rose Keagy
(74) *Attorney, Agent, or Firm* — JCIPRNET

(57) ABSTRACT

This disclosure provides a communication device and a manufacturing method thereof. The manufacturing method of the communication device includes the following steps: providing a first dielectric layer, wherein the first dielectric layer includes a first region and a second region, and the first dielectric layer has a first surface and a second surface opposite to the first surface; providing a second dielectric layer; combining the first dielectric layer and the second dielectric layer with a sealing element, so that the sealing element is disposed between the first surface of the first dielectric layer and a third surface of the second dielectric layer; after combining the first dielectric layer and the (Continued)

second dielectric layer, thinning the second surface of the first dielectric layer; and disposing a first communication element on the first surface of the first dielectric layer in the first region.

11 Claims, 18 Drawing Sheets

(51) Int. Cl.
H10D 1/64 (2025.01)
H10D 30/67 (2025.01)

(52) U.S. Cl.
CPC ..... H10D 30/6732 (2025.01); H10D 30/6745 (2025.01); H10D 30/6746 (2025.01); H10D 30/6755 (2025.01)

(58) Field of Classification Search
CPC .. H10D 1/64; H10D 30/6732; H10D 30/6745; H10D 30/6746; H10D 30/6755
See application file for complete search history.

(56) References Cited

U.S. PATENT DOCUMENTS

| | | | |
|---|---|---|---|
| 2016/0027665 A1 | 1/2016 | Li et al. | |
| 2016/0204183 A1* | 7/2016 | Tao ........................ | H10K 71/00 |
| | | | 438/34 |
| 2019/0035759 A1* | 1/2019 | Tsai .................... | H01L 21/4853 |
| 2019/0131253 A1 | 5/2019 | Lee et al. | |

FOREIGN PATENT DOCUMENTS

| | | | |
|---|---|---|---|
| TW | 200632487 | 9/2006 | |
| TW | I435426 | 4/2014 | |
| TW | 201433857 | 9/2014 | |
| WO | WO-2021041038 A1 * | 3/2021 | ............ B32B 17/06 |

OTHER PUBLICATIONS

"Search Report of Europe Counterpart Application", issued on May 8, 2023, p. 1-p. 9.
"Office Action of China Counterpart Application", issued on Jan. 29, 2026, p. 1-p. 9.

* cited by examiner

COMMUNICATION DEVICE AND MANUFACTURING METHOD THEREOF

CROSS-REFERENCE TO RELATED APPLICATION

This application claims the priority benefit of U.S. provisional application Ser. No. 63/286,102, filed on Dec. 6, 2021, and China application serial no. 202211033785.3, filed on Aug. 26, 2022. The entirety of each of the above-mentioned patent applications is hereby incorporated by reference herein and made a part of this specification.

BACKGROUND

Technical Field

The disclosure relates to a communication device and a manufacturing method thereof, and in particular relates to a communication device including a dielectric layer with thinned thickness and a manufacturing method thereof.

Description of Related Art

Communication devices have been widely used in the same field. With the vigorous development of communication devices, the development towards thinness and lightness has led to higher requirements for the reliability or quality of the communication devices.

SUMMARY

The disclosure provides a communication device and a manufacturing method thereof, which facilitates the signal transmission of a communication element.

The manufacturing method of the communication device of the disclosure includes the following operations. A first dielectric layer is provided. The first dielectric layer includes a first region and a second region, and the first dielectric layer has a first surface and a second surface opposite to the first surface. A second dielectric layer is provided. The first dielectric layer and the second dielectric layer are combined with a sealing element, so that the sealing element is disposed between the first surface of the first dielectric layer and a third surface of the second dielectric layer. After the first dielectric layer and the second dielectric layer are combined, the second surface of the first dielectric layer is thinned. A first communication element is disposed on the first surface of the first dielectric layer in the first region.

The communication device of the disclosure includes a dielectric layer and a communication element. The dielectric layer includes a first region and a second region, and has a first surface and a second surface opposite to the first surface. The communication element is disposed on the first surface of the dielectric layer in the first region. The dielectric layer has a first thickness in the first region, the dielectric layer has a second thickness in the second region, and the first thickness is smaller than the second thickness.

BRIEF DESCRIPTION OF THE DRAWING

The accompanying drawings are included to provide a further understanding of the disclosure, and are incorporated in and constitute a part of this specification. The drawings illustrate embodiments of the disclosure, and together with the description serve to explain principles of the disclosure.

DETAILED DESCRIPTION OF DISCLOSED EMBODIMENTS

Figure 1A:
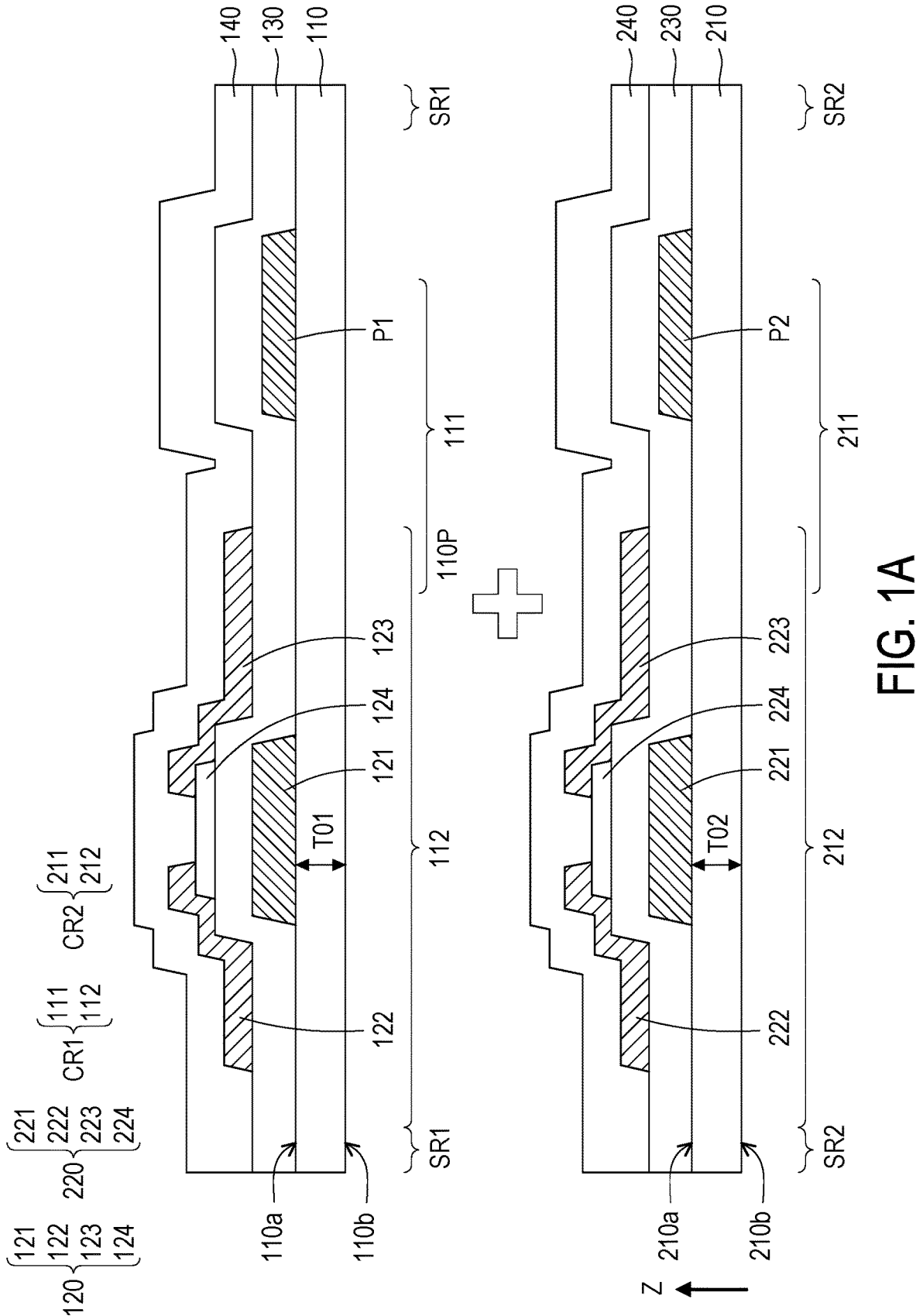
FIG. 1A to FIG. 1D are partial cross-sectional views illustrating the process of a manufacturing method of a communication device according to an embodiment.

The disclosure can be understood by referring to the following detailed description in conjunction with the accompanying drawings. It should be noted that, for the ease of understanding by the readers and for the brevity of the accompanying drawings, multiple drawings in the disclosure only depict a portion of the communication device, and the specific elements in the drawings are not drawn according to the actual scale. In addition, the number and size of each of the elements in the figures are for illustration purposes only, and are not intended to limit the scope of the disclosure.

In the following description and patent claims, words such as "comprising" and "including" are open-ended words, so they should be interpreted as meaning "including but not limited to . . . ".

It should be understood that when an element or layer is referred to as being "on" or "connected to" another element or layer, it may be directly on or directly connected to this other element or layer, or there may be an intervening element or layer in between (indirect case). In contrast, when an element is referred to as being "directly on" or "directly connected to" another element or layer, there are no intervening elements or layers present.

Although the terms "first", "second", "third", . . . may be used to describe various constituent elements, the constituent elements are not limited by the terms. The terms are only used to distinguish a single constituent element from other constituent elements in the specification. The same terms may not be used in the claim, but replaced by first, second, third . . . according to the order in which the elements are declared in the claim. Therefore, in the following description, the first constituent element may be the second constituent element in the claim.

As used herein, the terms "about," "approximately," "substantially," and "roughly" generally mean within 10%, within 5%, within 3%, within 2%, within 1%, or within 0.5% of a given value or range. The quantity given here is an approximate quantity, that is, even though "about," "approximately," "substantially," and "roughly" are not specified, the meaning of "about," "approximately," "substantially," and "roughly" are still implied.

In some embodiments of the disclosure, terms related to joining and connecting, such as "connected", "interconnected", etc., unless otherwise defined, may mean that two structures are in direct contact, or may also mean that two structures are not in direct contact, in which there are other structures located between these two structures. The terms related to joining and connecting can also include the case where both structures are movable, or both structures are fixed. Furthermore, the term "coupled" includes any direct and indirect means of electrical connection.

In some embodiments of the disclosure, optical microscopy (OM), scanning electron microscope (SEM), film thickness profiler ($\alpha$-step), ellipsometer, or other suitable methods may be used to measure the area, width, thickness, or height of each element, or the distance or pitch between elements. In detail, according to some embodiments, a scanning electron microscope can be used to obtain a cross-sectional structure image including a component to be measured, and to measure the area, width, thickness, or height of each element, or the distance or pitch between elements.

The communication device of the disclosure may include an antenna device, a sensing device, or a splicing device, but not limited thereto. The communication device may be a bendable or flexible communication device. The antenna device may be, for example, a liquid crystal antenna, but not limited thereto. The splicing device may be, for example, an antenna splicing device, but not limited thereto. It should be noted that, the communication device can be any arrangement and combination of the foregoing, but not limited thereto. Hereinafter, a communication device is used to illustrate the disclosure, but the disclosure is not limited thereto.

It should be noted that, in the following embodiments, the features in several different embodiments can be replaced, reorganized, and mixed to complete other embodiments without departing from the spirit of the disclosure. As long as the features of the various embodiments do not violate the spirit of the disclosure or conflict with one another, they can be mixed and matched arbitrarily.

References of the exemplary embodiments of the disclosure are to be made in detail. Examples of the exemplary embodiments are illustrated in the drawings. If applicable, the same reference numerals in the drawings and the descriptions indicate the same or similar parts.

FIG. 1A to FIG. 1D are partial cross-sectional views illustrating the process of a manufacturing method of a communication device according to an embodiment. FIG. 1E is a top schematic view of the manufacturing method of the communication device of FIG. 1A. The manufacturing method of the communication devices 100 and 200 of this embodiment may include the following steps.

Figure 1B:
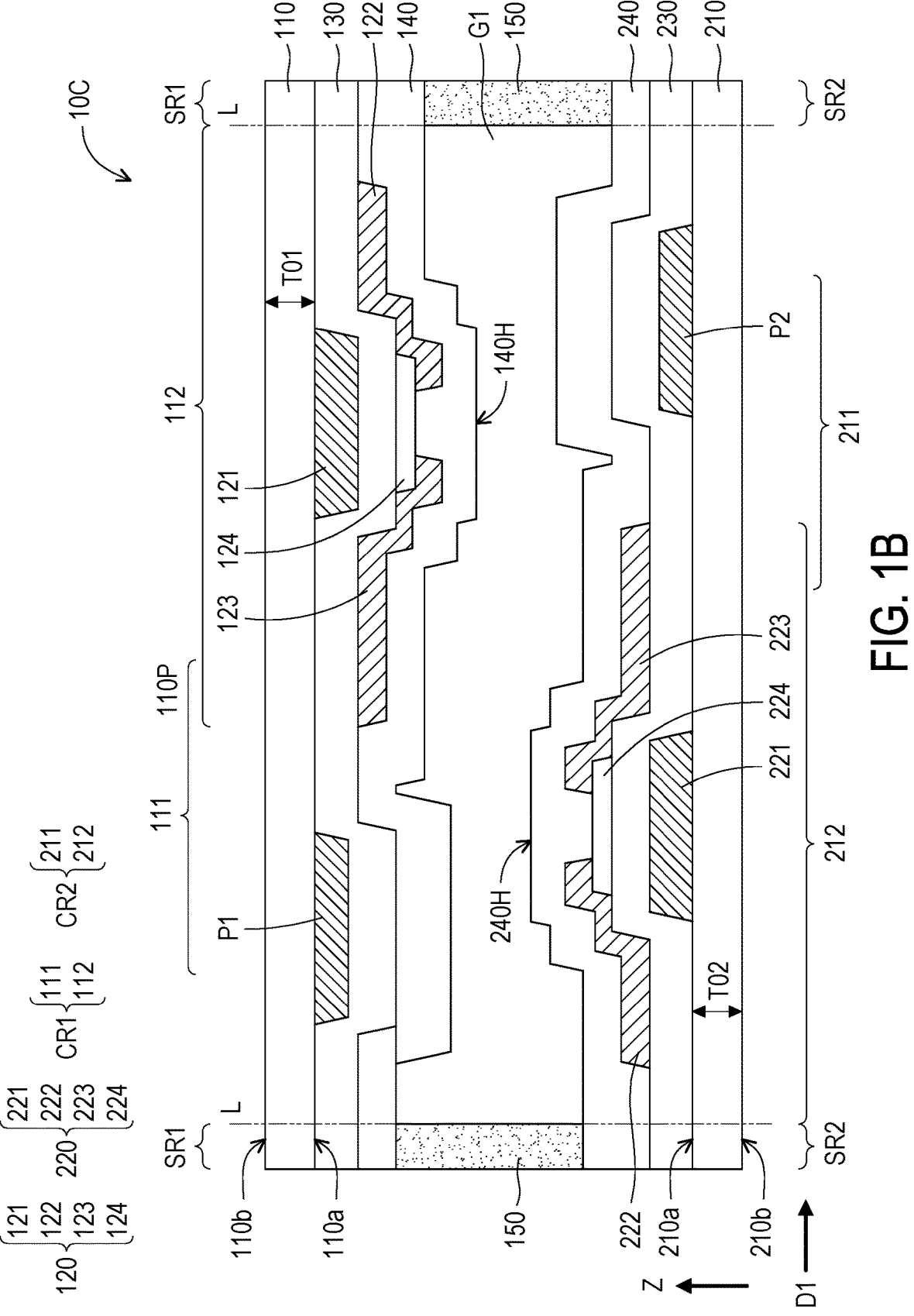
Figure 1C:
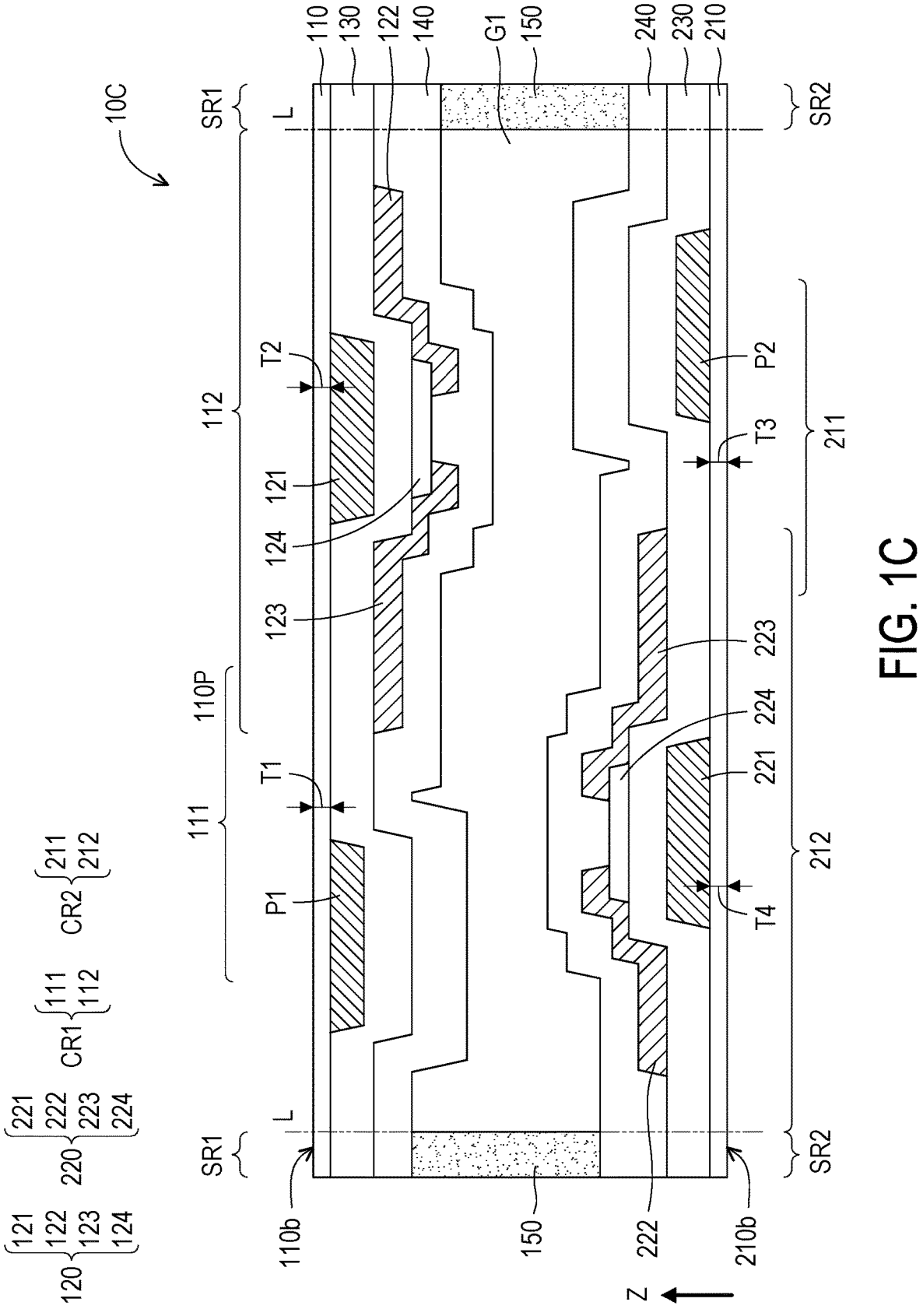
Figure 1D:
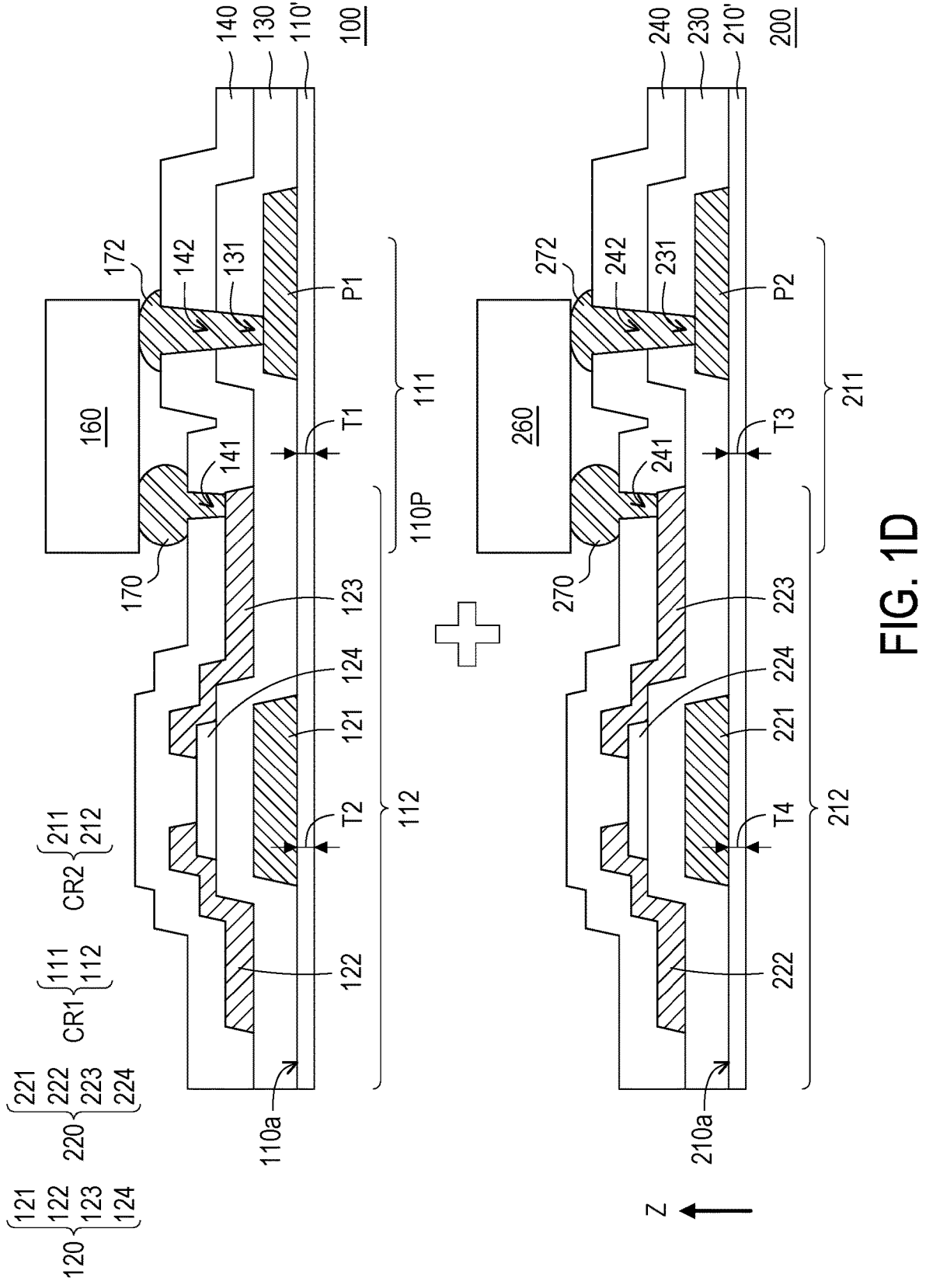
Figure 1E:
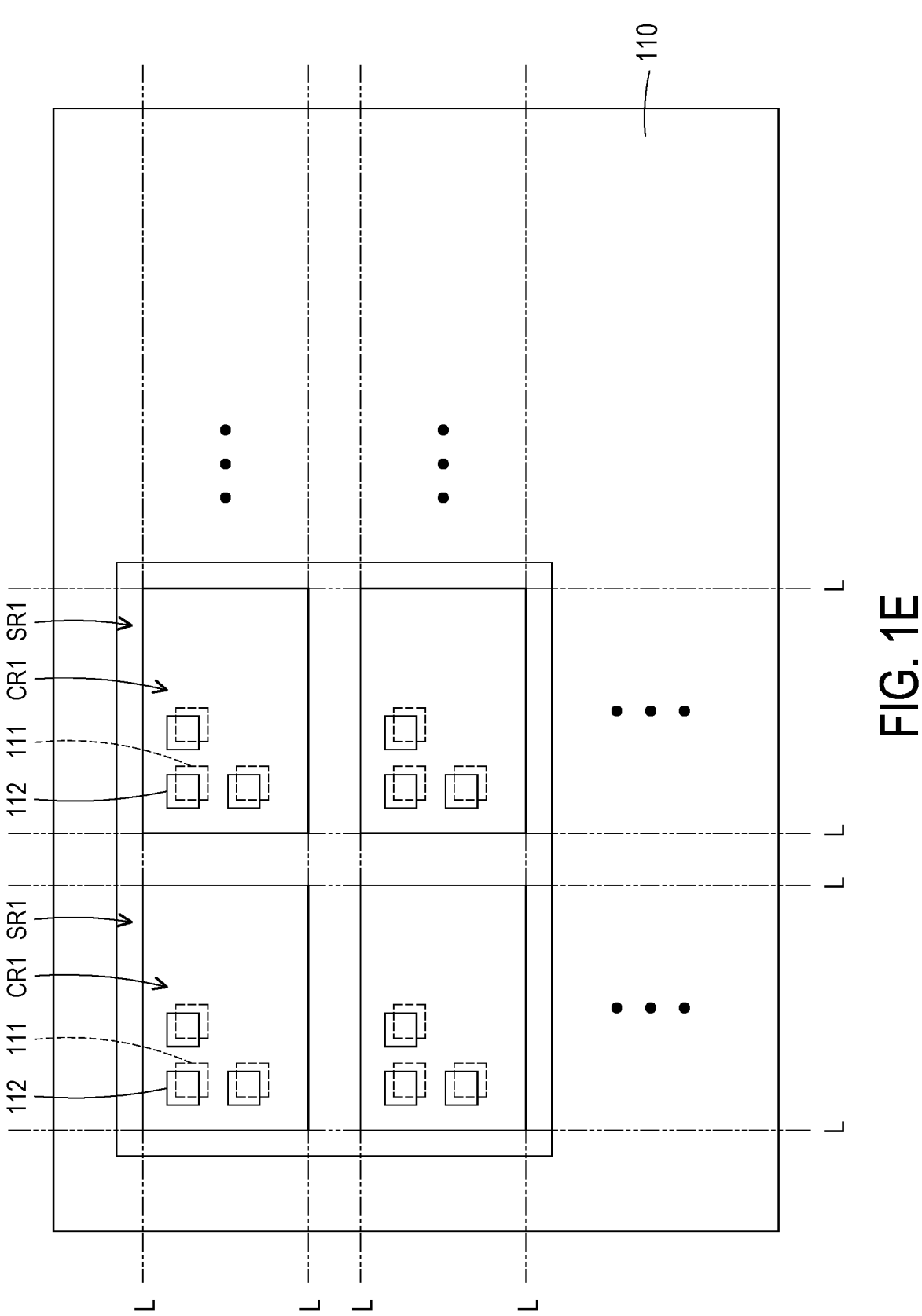
FIG. 1E is a top schematic view of the manufacturing method of the communication device of FIG. 1A.

First, referring to FIG. 1A and FIG. 1E, a first dielectric layer (for example, a first substrate) 110 is provided first. The first substrate 110 includes multiple element regions CR1 and multiple sealing regions SR1. Each of the element regions CR1 is adjacent to the corresponding sealing region SR1, and each of the element regions CR1 is surrounded by the corresponding sealing region SR1. Each of the element regions CR1 may include multiple first regions 111 and multiple second regions 112. For convenience of description, FIG. 1E schematically illustrates three first regions 111 and three second regions 112 in each of the element regions CR1 as an example, but the disclosure does not limit the number of the first regions 111 and the number of the second regions 112 in each of the element regions CR1. In FIG. 1E, to simplify the description, the shape of the first region 111 and the shape of the second region 112 are square as an example, but the disclosure is not limited thereto, and the shape of the first region 111 and the shape of the second region 112 are not limited.

According to some embodiments, as shown in FIG. 1D, the first region 111 may be the disposition region of a first communication element 160 in the subsequent process, and the second region 112 may be the disposition region of a first control element 120 in the subsequent process. The first region 111 and the second region 112 are adjacent to each other, the second region 112 is located between the first region 111 and the sealing region SR1, and the first region 111 may partially overlap the second region 112 (i.e., there is an overlapping portion 110P between the first region 111 and the second region 112). According to some embodiments, the overlapping portion 110P of the first region 111 and the second region 112 may be a region where the first communication element 160 is electrically connected with the first control element 120, but not limited thereto. In some embodiments, the first region 111 may also be slightly larger or smaller than the disposition region of the first communication element 160. In some embodiments, the second region 112 may also be slightly larger or smaller than the disposition region of the first control element 120. According to some embodiments, although not shown, the first region 111 and the second region 112 may not have overlapping portions.

As shown in FIG. 1A, a first dielectric layer (for example, a first substrate) 110 and a second dielectric layer (for example, a second substrate) 210 are provided. The first dielectric layer (the first substrate) includes a first region 111 and a second region 112, and first dielectric layer (the first substrate) has a first surface 110a and a second surface 110b opposite to the first surface. For easy understanding, in the following descriptions, the first substrate can be taken as an example of the first dielectric layer 110, and the second substrate can be taken as an example of the second dielectric layer 110. As shown in FIG. 1B, the first substrate 110 and the second substrate 210 are combined with the sealing element 150, so that the sealing element 150 is disposed between the first surface 110a of the first substrate 110 and a third surface 210a of the second substrate 210. As shown in FIG. 1C, after combining the first substrate 110 and the second substrate 210, the second surface 110b of the first substrate 110 is thinned. For example, according to some embodiments, the thickness of the first substrate 110 is thinned from a thickness T01 in FIG. 1B to a thickness T1 in FIG. 1C, and the thickness T1 is smaller than the thickness T01. As shown in FIG. 1D, the first communication element 160 is disposed on the first surface 110a of a first substrate 110' in the first region 111. The order of disposing the first communication element 160 is not particularly limited. According to some embodiments, the step of disposing the first communication element 160 may be performed after combining the first substrate 110 and the second substrate 210. According to some embodiments, the step of disposing the first communication element 160 may be performed before combining the first substrate 110 and the second substrate 210. It will be described in detail in the following embodiments. According to some embodiments, the first dielectric layer 110 and the second dielectric layer 210 can have the same material. According to some embodiments, the first dielectric layer 110 and the second dielectric layer 210 can have different materials.

As shown in FIG. 1A, the first substrate 110 has a first surface 110a and a second surface 110b opposite to the first surface 110a. In this embodiment, the first substrate 110 may include a rigid substrate, a flexible substrate or a combination thereof. For example, the material of the first substrate 110 may be glass, but not limited thereto. In some embodiments, the material of the first substrate 110 may also include quartz, sapphire, ceramics, polycarbonate (PC), polyimide (PI), polyethylene terephthalate (PET), other suitable substrate materials, or a combination thereof, but not limited thereto. According to some embodiments, the thickness T01 of the first substrate 110 may be between 0.5 mm and 3 mm, for example, between 0.7 mm and 2 mm.

Then, continue referring to FIG. 1A and FIG. 1E, before combining the first substrate 110 and the second substrate 210, the first control element 120 is disposed on the first surface 110*a* of the first substrate 110 in the second region 112. For convenience of description, FIG. 1A only shows one first control element 120 as an example for illustration, but the disclosure does not limit the number of the first control elements 120 in each of the element region CR1. In this embodiment, each of the first control elements 120 may correspond to at least one bonding pad P1. In one element region CR1, the bonding pads P1 corresponding to the first control elements 120 may be electrically connected to each other, and the bonding pads P1 may be electrically connected to a common electrode or ground. At least a portion of the bonding pads P1 may be disposed in the first region 111 of the first substrate 110.

In this embodiment, the first control element 120 may include a gate electrode 121, a source electrode 122, a drain electrode 123, and a semiconductor 124. Specifically, the gate electrode 121 is disposed on the second region 112 of the first substrate 110, and the bonding pad P1 is disposed on the first region 111 of the first substrate 110. According to some embodiments, the bonding pad P1 and an electrode in the first control element 120 may be the same layer. For example, the bonding pad P1 and the gate electrode 121 in the first control element 120 may be the same layer, but the disclosure is not limited thereto. A gate insulating layer 130 is disposed on the gate electrode 121 and the bonding pad P1, and the gate insulating layer 130 may cover the gate electrode 121 and the bonding pad P1. The semiconductor 124 is disposed on the gate electrode 121 and the gate insulating layer 130. The source electrode 122 and the drain electrode 123 may be electrically connected to the semiconductor 124, respectively. For example, the source electrode 122 and the drain electrode 123 may be disposed on the semiconductor 124. The insulating layer 140 is disposed on the source electrode 122 and the drain electrode 123, and the insulating layer 140 may cover the source electrode 122 and the drain electrode 123. In this embodiment, although the structure of the first control element 120 may be a bottom gate transistor, the disclosure does not limit the form of the first control element 120. In some embodiments, the structure of the first control element may also be a top gate transistor or a dual gate (dual gate or double gate) transistor. According to some embodiments, when the first control element 120 is a top gate transistor, the gate electrode 121 is disposed above the semiconductor 124.

Then, continue referring to FIG. 1A, the second substrate 210 is provided, and before the first substrate 110 and the second substrate 210 are combined, the second control element 220 is disposed on the third surface 210*a* of the second substrate 210. Similarly, bonding pads P2 may be disposed on the third surface 210*a* of the second substrate 210. At least a portion of the bonding pads P2 may be disposed in the first region 211 of the second substrate 210. Similar to the first substrate, the second substrate 210 includes multiple element regions CR2 and multiple sealing regions SR2, each of the element regions CR2 is adjacent to the corresponding sealing region SR2, and each of the element region CR2 is surrounded by the corresponding sealing region SR2. Each of the element regions CR2 may include multiple first regions 211 and multiple second regions 212. The dispositions and uses of the first region 211 and the second region 212 are substantially similar to those of the first region 111 and the second region 112 of the first substrate 110, and reference may also be made to the first substrate 110 in FIG. 1E, thus details are not repeated herein.

The second substrate 210 has a third surface 210*a* and a fourth surface 210*b* opposite to the third surface 210*a*. For the material of the second substrate 210, reference may be made to the material of the first substrate, thus details are not repeated herein. The material of the second substrate 210 may be the same as or different from that of the first substrate 110. According to some embodiments, as shown in FIG. 1A, the thickness T02 of the second substrate 210 may be between 0.5 mm and 3 mm, for example, between 0.7 mm and 2 mm. In this embodiment, the second control element 220 is disposed on the third surface 210*a* of the second substrate 210 in the second region 212, and the bonding pad P2 is disposed on the third surface 210*a* of the second substrate 210 in the first region 211. The second control element 220 may include a gate electrode 221, a source electrode 222, a drain electrode 223, and a semiconductor 224. A gate insulating layer 230 is disposed between semiconductor 224 and the gate electrode 221, and an insulating layer 240 is disposed on the source electrode 222 and the drain electrode 223. The disposition of the second control element 220 and the bonding pad P2 may be substantially the same as that of the first control element 120 and the bonding pad P1, thus details are not repeated herein.

In this embodiment, the materials of the semiconductor 124 and the semiconductor 224 may include amorphous silicon, low temperature polysilicon (LTPS), metal oxide, other suitable materials, or a combination thereof, but not limited thereto. The metal oxide may be, for example, indium gallium zinc oxide (IGZO). The gate insulating layer 130, the gate insulating layer 230, the insulating layer 140, and the insulating layer 240 may have a single-layer structure or a multi-layer structure, and may include organic materials, inorganic materials, or a combination thereof, but not limited thereto. The inorganic material may be, for example, silicon nitride, silicon oxide, or a combination thereof. In addition, in this embodiment, the first control element 120 and the second control element 220 may be thin-film transistors (TFTs) or other suitable switching elements to transmit signal to the communication element, but not limited thereto.

Then, referring to FIG. 1B, the first substrate 110 and the second substrate 210 are combined with the sealing element 150, so that the sealing element 150 is disposed between the first surface 110*a* of the first substrate 110 and the third surface 210*a* of the second substrate 210, and a combined board 10C is obtained. Specifically, the sealing element 150 is coated on the sealing region SR1 of the first substrate 110 (or on the sealing region SR2 of the second substrate 210) and between the insulating layer 140 and the insulating layer 240, so that the first substrate 110 and the second substrate 210 may be combined together through the sealing element 150. Referring to FIG. 1E, the region where the sealing element 150 is disposed may be the sealing region SR1. Specifically, in this embodiment, the first substrate 110 disposed with the first control element 120 is first turned upside down, so that the first surface 110*a* of the first substrate 110 may face the third surface 210*a* of the second substrate 210, so that the bonding pad P1 may overlap the second control element 220 in the normal direction Z of the first substrate 110 (or the second substrate 210), and that the first control element 120 may overlap the bonding pad P2 in the normal direction Z of the first substrate 110 (or the second substrate 210). In detail, according to some embodiments, as shown in FIG. 1B, the sealing region SR1 of the first substrate 110 and the sealing region SR2 of the second substrate 210 are aligned in the normal direction Z of the first substrate 110, so that the first substrate and the second substrate are combined into the combined board 10C.

In detail, according to some embodiments, as shown in FIG. 1B, the gate electrodes 121 on the first substrate 110 and the gate electrodes 221 on the second substrate 210 may be disposed in a staggered form in a direction D1, so that the first control element 120 and the second control element 220 are not damaged due to the combined stacking of the two substrates. The direction D1 may represent a direction on the surface 110a of the first substrate 110, which is perpendicular to the normal direction Z. In addition, according to some embodiments, a high point 140H of the insulating layer 140 overlapping the gate electrode 121 in the normal direction Z, and a high point 240H of the insulating layer 240 overlapping the gate electrode 221 in the normal direction Z, may be disposed in a staggered form in the direction D1, so that the first control element 120 and the second control element 220 are not damaged due to stacking. In other words, the high point 140H of the insulating layer 140 on the first substrate 110 in the normal direction Z and the high point 240H of the insulating layer 240 on the second substrate 210 in the normal direction Z do not overlap in the normal direction Z. The high point 140H may be the position where the insulating layer 140 is farthest from the first substrate 110, and the high point 240H may be the position where the insulating layer 240 is farthest away from the second substrate 210.

According to some embodiments, as shown in FIG. 1B, in the normal direction Z of the first substrate 110 (or the second substrate 210), the sealing element 150 may overlap the sealing region SR1, but does not overlap the first control element 120, the second control elements 220, the bonding pad P1, and the bonding pad P2. In this embodiment, the material of the sealing element 150 may include a sealing agent or other waterproof and acid-resistant adhesive materials. In some embodiments, the sealing element 150 may be a photo-curable glue, a heat-curable glue, or a combination thereof. In some embodiments, the sealing element 150 may be cured by heating or UV light irradiation. According to some embodiments, the sealing element 150 may be a sealant.

In this embodiment, when the first substrate 110 and the second substrate 210 are combined by the sealing element 150, an air gap G1 may be formed between the insulating layer 140 and the insulating layer 240, so that the insulating layer 140 and the insulating layer 240 may be separated by a distance in the normal direction Z of the first substrate 110 (or the second substrate 210), and that the insulating layer 140 does not contact the insulating layer 240. The air gap G1 may be surrounded and defined by the insulating layer 140, the sealing element 150, and the insulating layer 240.

Then, referring to FIG. 1C, after combining the first substrate 110 and the second substrate 210, the second surface 110b of the first substrate 110 is thinned. According to some embodiments, the fourth surface 210b of the second substrate 210 may be selectively thinned. Specifically, in this embodiment, the first substrate 110 and the second substrate 210 are etched with an etching solution, so as to reduce the thickness of the first substrate 110 and the second substrate 210. At this time, due to the disposition of the sealing element 150, the etching solution does not enter the air gap G1, so the first control element 120 and the second control element 220 may be protected, and the damage to the first control element 120 and the second control element 220 due to the etching solution may be reduced. In this embodiment, when the first substrate 110 is glass, the etching solution may be a glass etching solution, and the glass etching solution may be, for example, hydrogen fluoride (HF), but not limited thereto.

In addition, in this embodiment, in detail, after thinning the second surface 110b of the first substrate 110, as shown in FIG. 1B and FIG. 1C, the thickness of the first substrate 110 may be thinned from the thickness T01 shown in FIG. 1B to T1 and T2 shown in FIG. 1C. As shown in FIG. 1C, the first region 111 of the first substrate 110 may have a first thickness T1, and the second region 112 of the first substrate 110 may have a second thickness T2. The first thickness T1 may be substantially equal to the second thickness T2, but not limited thereto. In this embodiment, after thinning the fourth surface 210b of the second substrate 210, the thickness of the second substrate 210 may be thinned from the thickness T02 shown in FIG. 1B to T3 and T4 shown in FIG. 1C. As shown in FIG. 1C, the first region 211 of the second substrate 210 may have a third thickness T3, and the second region 212 of the second substrate 210 may have a fourth thickness T4. The third thickness T3 may be substantially equal to the fourth thickness T4, but not limited thereto. The first thickness T1 is, for example, a thickness measured along the normal direction Z of the first region 111 of the first substrate 110. The second thickness T2 is, for example, a thickness measured along the normal direction Z in the region of the first substrate 110 corresponding to the gate electrode 121. The third thickness T3 is, for example, a thickness measured along the normal direction Z of the first region 211 of the second substrate 210. The fourth thickness T4 is, for example, a thickness measured along the normal direction Z in the region of the second substrate 210 corresponding to the gate electrode 221. The aforementioned thicknesses T1, T2, T3, and T4 may be the minimum thicknesses measured in the aforementioned corresponding regions, but are not limited thereto.

According to some embodiments, after thinning, the first thickness T1 (or the second thickness T2) of the first substrate 110 and the third thickness T3 (or the fourth thickness T4) of the second substrate 210 may be thinned to within a range of 0.1 mm to 1 mm, for example, within a range of 0.2 mm to 0.8 mm, for example, within a range of 0.3 mm to 0.5 mm, but not limited thereto. The thickness of the first substrate 110 (or the second substrate 210) is, for example, the thickness of the first substrate 110 (or the second substrate 210) measured along the normal direction Z. After thinning, the first thickness T1 of the first substrate 110 and the third thickness T3 of the second substrate 210 may be the same or different.

Then, referring to FIG. 1D, the sealing element 150 is removed to separate the first substrate 110 and the second substrate 210. Specifically, for example, as shown in FIG. 1C, cutting is performed along the cutting line L, and the sealing element 150 located in the sealing region SR1 is removed. In this way, the combined board 10C may be cut into multiple first substrate units and multiple second substrate units, as shown in FIG. 1D. For convenience of description, FIG. 1C only shows two cutting lines L, however, as shown in FIG. 1E, there may be multiple cutting lines L. In detail, the cutting may be performed along multiple cutting lines L on the first substrate 110. As shown in FIG. 1D, the first substrate unit may include the cut first substrate 110' and the first control elements 120 and bonding pad P1 on the first substrate 110', and the second substrate unit may include the cut second substrate 210 and the second control element 220 and the bonding pad P2 on the second substrate 210'. After cutting, multiple first substrates 110' may be cut from the first substrate 110, and multiple second substrates 210' may be cut from the second substrate 210.

According to some embodiments, the cutting method may be, for example, laser cutting or wheel cutting. Multiple cuts may be adopted according to actual requirements. For example, the sealing element 150 around the combined board 10C may be cut and removed first, and then the sealing elements between the element regions CR1 may be cut and removed, but the disclosure is not limited to this. According to some embodiments, cutting may be performed along the cutting line L at the boundary located between the element region CR1 and the sealing region SR1 (or at the boundary located between the element region CR2 and the sealing region SR2) to remove the sealing element 150 located in the sealing region SR1 of the first substrate 110, therefore multiple cut first substrates 110' and multiple cut second substrates 210' are separated and obtained. Since the sealing region SR1 of the first substrate 110 and the sealing region SR2 of the second substrate 210 are aligned in the normal direction Z, in other words, cutting also removes the sealing element 150 located in the sealing region SR2 of the second substrate 210.

Then, referring to FIG. 1D, the first communication element 160 is disposed on the aforementioned cut first substrate unit. In detail, the first communication element 160 is disposed on the first surface 110a of the first substrate 110' in the first region 111. According to some embodiments, as shown in FIG. 1C, after thinning, the sealing element 150 is removed to separate the first substrate 110 and the second substrate 210. Then, as shown in FIG. 1D, the first communication element 160 is disposed on the first surface 110a of the separated first substrate 110' in the first region 111, and the first communication element 160 is electrically connected with the first control element 120. In this way, the communication device 100 shown in FIG. 1D is obtained. To simplify the description, the communication device 100 in FIG. 1D only shows one first control element 120 and one first communication element 160; however, in fact, in the communication device 100, multiple first control elements 120 and multiple first communication elements 160 may be disposed on the cut first substrate 110', and each of the first communication elements 160 may be electrically connected to a corresponding first control element 120.

Specifically, in this embodiment, referring to FIG. 1D, the method for disposing the first communication element 160 may include but is not limited to the following steps. Firstly, openings 141 and 142 are formed in the insulating layer 140, and an opening 131 is formed in the gate insulating layer 130. The opening 141 may expose a portion of the drain electrode 123, and the opening 142 may be connected to the opening 131 to expose a portion of the bonding pad P1. Next, a first conductive member 170 is formed on the insulating layer 140 and in the opening 141, so that the first conductive member 170 may contact the drain electrode 123. A second conductive member 172 is formed on the insulating layer 140 and in the opening 142 and the opening 131, so that the second conductive member 172 may contact the bonding pad P1. Next, the first communication element 160 is bonded to the first conductive member 170 and the second conductive member 172, so that the first communication element 160 may be electrically connected to the first control element 120 through the first conductive member 170, and that the first communication element 160 may be electrically connected to the bonding pad P1 through the second conductive member 172. The first communication element 160 may overlap the first region 111 in the normal direction Z of the first substrate 110'. The first communication element 160 may be a varactor or other suitable high-frequency components, but not limited thereto.

Then, continue referring to FIG. 1D, according to some embodiments, a second communication element 260 is disposed on the aforementioned cut second substrate unit. In detail, the second communication element 260 is disposed on the third surface 210a of the second substrate 210' in the first region 211. According to some embodiments, as shown in FIG. 1C, after thinning, the sealing element 150 is removed to separate the first substrate 110 and the second substrate 210. Then, as shown in FIG. 1D, the second communication element 260 is disposed on the third surface 210a of the separated second substrate 210', and the second communication element 260 is electrically connected with the second control element 220. In this way, the communication device 200 shown in FIG. 1D is obtained. To simplify the description, the communication device 200 in FIG. 1D only shows one second control element 220 and one second communication element 260; however, in fact, in the communication device 200, multiple second control elements 220 and multiple second communication elements 260 may be disposed on the cut second substrate 210', and each of the second communication elements 260 may be electrically connected to a corresponding second control element 220.

In the present embodiment, referring to FIG. 1D, the disposing method of the second communication element 260 may be substantially similar to the disposing method of the first communication element 160, thus details are not repeated herein. Specifically, a first conductive member 270 may be disposed on the insulating layer 240 and in the opening 241 of the insulating layer 240, and the first conductive member 270 may contact the drain electrode 223. A second conductive member 272 may be disposed on the insulating layer 240, in the opening 242 of the insulating layer 240, and in the opening 231 of the gate insulating layer 230, and the second conductive member 272 may contact the bonding pad P2. The second communication element 260 may be bonded to the first conductive member 270 and the second conductive member 272, the second communication element 260 may be electrically connected to the second control element 220 through the first conductive member 270, and the second communication element 260 may be electrically connected to the bonding pad P2 through the second conductive member 272. The second communication element 260 may overlap the first region 211 in the normal direction Z of the second substrate 210'. The second communication element 260 may be a varactor or other suitable high-frequency components to send out high-frequency signals, but not limited thereto.

In this embodiment, the voltage of the gate electrode 121 of the first control element 120 may be configured to control the on or off state of the first control element 120. When the first control element 120 is turned on, the first control element 120 may transmit a signal to the first communication element 160 through the drain electrode 123 to change the characteristics (e.g., capacitance) of the first communication element 160, thereby modulating the phase of the high-frequency signal.

In addition, as shown in FIG. 1D, the signal (e.g., the high-frequency signal) sent by the first communication element 160 passes through the first substrate 110', and the high-frequency signal after passing through the first substrate 110' may be attenuated. According to some embodiments, the thickness of the first substrate 110' is thinned, so that the attenuation of the high-frequency signal after passing through the first substrate 110' may be reduced, thereby facilitating the high-frequency signal sent by the communication element to pass through the first substrate 110', which facilitates the signal transmission of the communication element. Similarly, the thinning of the thickness of the second substrate 210' also facilitates the signal transmission of the second communication element 260.

Figure 6:
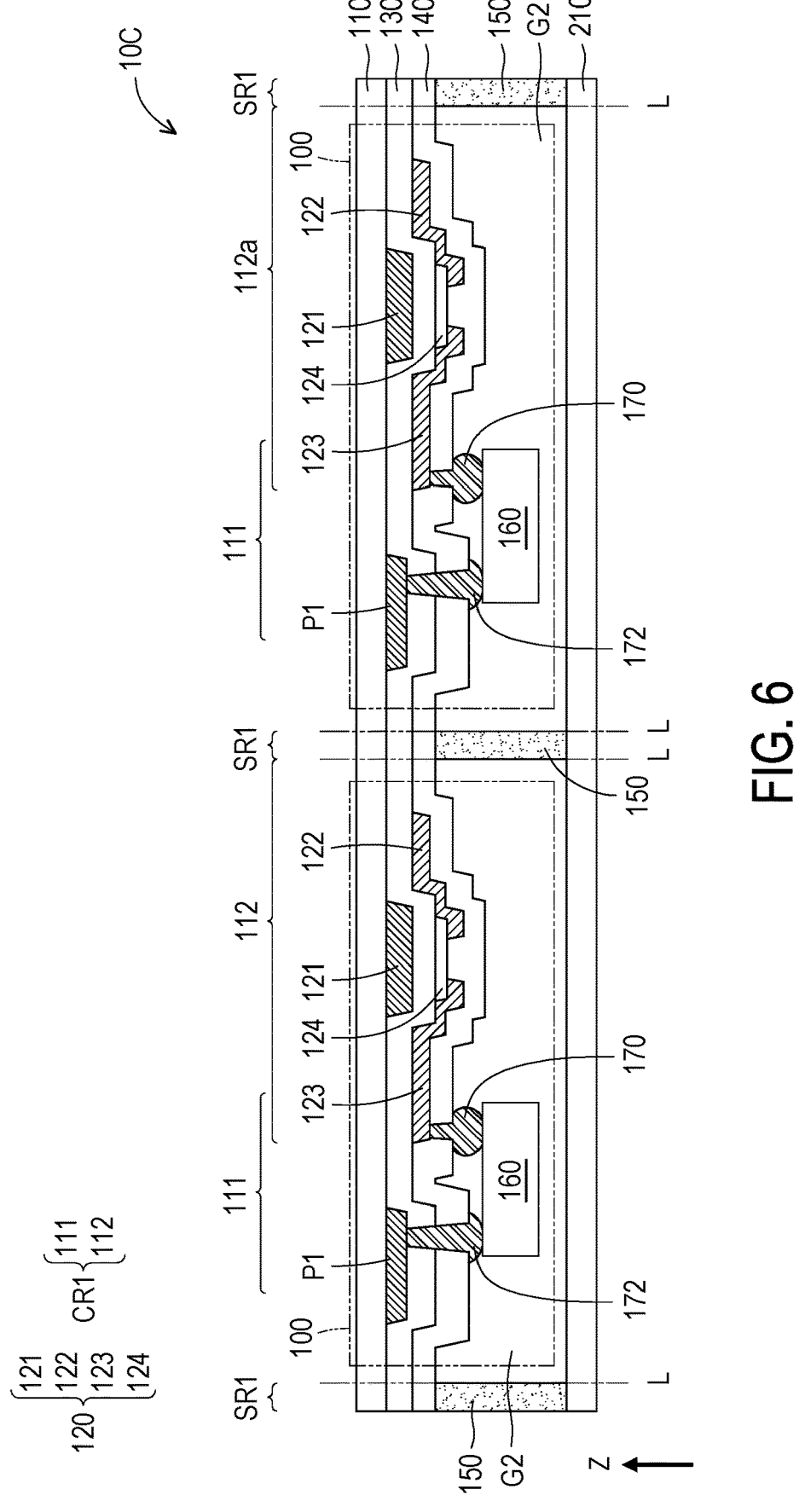
FIG. 6 is a partial cross-sectional view illustrating the process of a manufacturing method of a communication device according to another embodiment.

FIG. 6 is a partial cross-sectional view illustrating the process of a manufacturing method of a communication device according to another embodiment. The embodiment shown in FIG. 6 is similar to the embodiment shown in the aforementioned FIG. 1D, therefore, the same elements are denoted by the same reference numerals, and the detailed contents thereof are not repeated. In the manufacturing method of the embodiment of FIG. 6, the second substrate 210 may be a simple substrate, and the control element and the communication element may not be disposed on the surface of the second substrate 210. According to some embodiments, as shown in FIG. 6, the first communication element 160 may be disposed before combining the first substrate 110 and the second substrate 210. Subsequently, the first communication element 160 is electrically connected with the first control element 120. In detail, the first substrate 110 is provided, on which the first control element 120 and the first communication element 160 are disposed. Similar to the above, the first communication element 160 may be electrically connected to the first control element 120 via the first conductive member 170, thus details are not repeated herein. Next, the first substrate 110 and the second substrate 210 are combined with the sealing element 150. Next, the first substrate 110 and/or the second substrate 210 are thinned. After thinning, cutting is performed to remove the sealing element 150. The removing method of the sealing element 150 may be seen from the description above, thus details are not repeated herein.

Specifically, referring to FIG. 6 and FIG. 1E, after cutting the combined board 10C along multiple cutting lines L, multiple communication devices 100 may be obtained. To simplify the description, FIG. 6 only schematically illustrates two communication devices 100 as an example. Each of the communication devices 100 may include at least one first control element 120, one first communication element 160, and one bonding pad P1. According to some embodiments, each of the communication devices 100 may include multiple first control elements 120, multiple first communication elements 160, and multiple bonding pads P1. Each of the first communication elements 160 is electrically connected to the corresponding first control element 120.

According to some embodiments, in the case where the second communication element is disposed on the second substrate, although not shown, the second control element 220 and the second communication element 260 may be disposed before the first substrate 110 and the second substrate 210 are combined. Subsequently, the second communication element 260 is electrically connected with the second control element 220. Similar to the above, as shown in FIG. 1D, the second communication element 260 may be electrically connected to the second control element 220 via the first conductive member 270, thus details are not repeated herein. Then, the first substrate 110 and the second substrate 210 are combined with the sealing element 150. Next, the first substrate and/or the second substrate are thinned. After thinning, the sealing element 150 is removed.

Other embodiments are described below for illustrative purposes. It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not repeated herein.

Figure 2A:
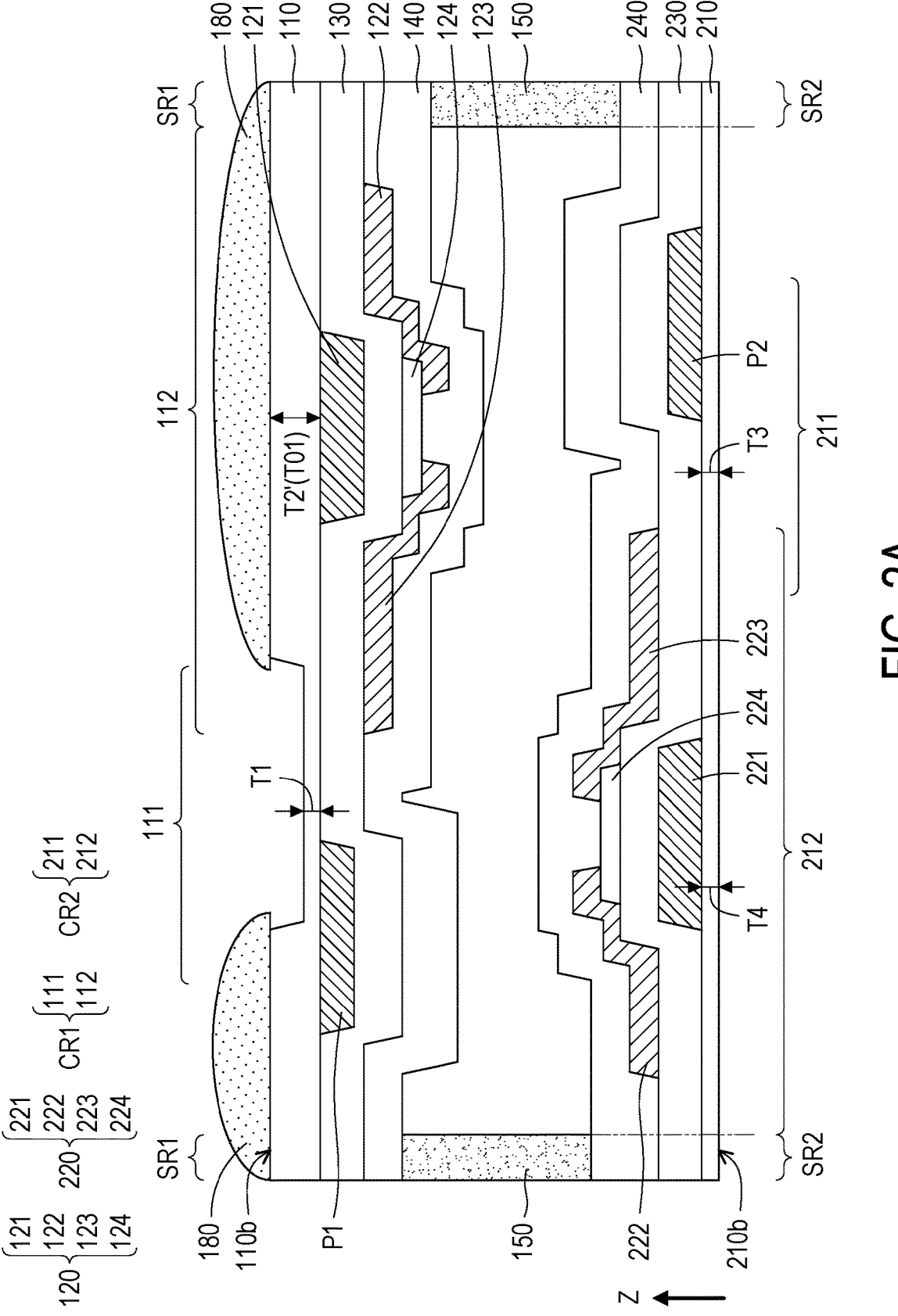
FIG. 2A to FIG. 2B are partial cross-sectional views illustrating the process of a manufacturing method of a communication device according to another embodiment.
Figure 2B:
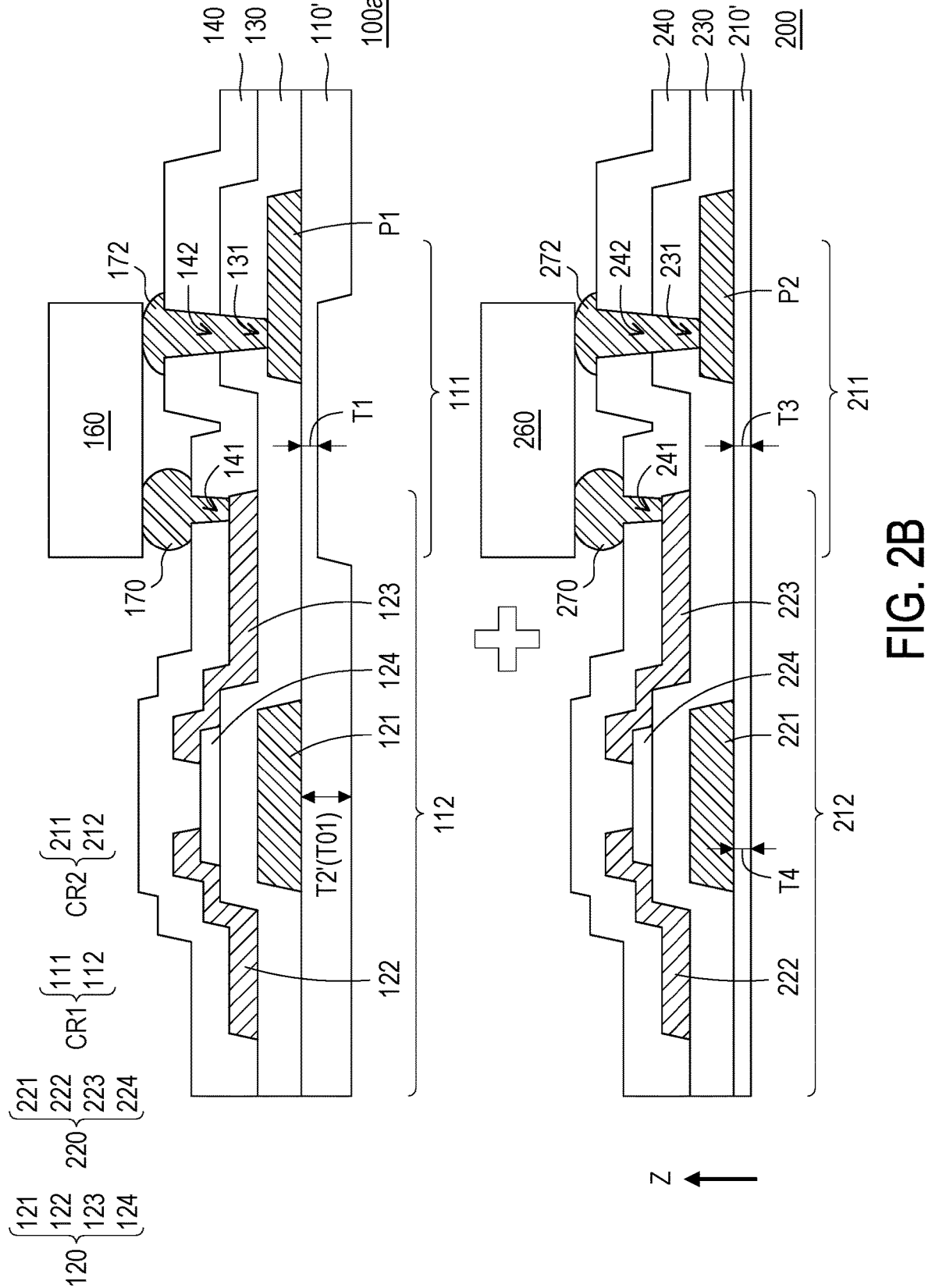

FIG. 2A to FIG. 2B are partial cross-sectional views illustrating the process of a manufacturing method of a communication device according to another embodiment. FIG. 2A to FIG. 2B are steps continuing from FIG. 1B and replacing FIG. 1C to FIG. 1D. The same or similar components in the embodiment of FIG. 2A to FIG. 2B and the embodiment of FIG. 1A to FIG. 1D may proceed by adopting the same materials or methods; therefore, the same and similar descriptions in the two embodiments are not repeated hereafter, and the differences between the two embodiments are mainly described.

Specifically, the manufacturing method of the communication devices 100a and 200 of this embodiment further includes the following steps.

Referring to FIG. 2A, after the first substrate 110 and the second substrate 210 are combined with the sealing element 150 and before the second surface 110b of the first substrate 110 is thinned, a photoresist layer 180 is disposed on at least a portion of the second surface 110b of the first substrate 110 in the second region 112. Next, thinning is performed again, for example, with an etching solution. Since the photoresist layer 180 may cover the second region 112 of the first substrate 110 and expose the first region 111 of the first substrate 110, during thinning (e.g., etching), the etching solution etches the first region 111 of the first substrate 110 and the second substrate 210, but does not etch the second region 112 of the first substrate 110. Therefore, after thinning the second surface 110b of the first substrate 110, the first substrate 110 has the first thickness T1 in the first region 111, the first substrate 110 has the second thickness T2' in the second region 112, and the first thickness T1 may be smaller than the second thickness T2'. According to some embodiments, the third thickness T3 of the first region 211 of the second substrate 210 may be substantially equal to the fourth thickness T4 of the second region 212 of the second substrate 210. The third thickness T3 and the fourth thickness T4 may be smaller than the second thickness T2'. According to some embodiments, when the aforementioned thinning step is performed, only the thickness of the first substrate 110 may be thinned, but the thickness of the second substrate 210 may not be thinned. According to some embodiments, when the aforementioned thinning step is performed, the thickness of the first substrate 110 and the thickness of the second substrate 210 may be thinned simultaneously.

In this embodiment, the thinned first thickness T1, the third thickness T3 and the fourth thickness T4 may be, for example, in the range of 0.1 mm to 1 mm, such as in the range of 0.2 mm to 0.8 mm, such as in the range of 0.3 mm to 0.5 mm, but not limited thereto. The second thickness T2' may be the thickness of the first substrate 110 that is not thinned, and the second thickness T2' may be substantially equal to the aforementioned original thickness T01 of the first substrate 110. According to some embodiments, the second thickness T2' may be between 0.5 mm and 3 mm, such as between 0.7 mm and 2 mm. The difference between the first thickness T1 and the second thickness T2' may be, for example, between 0.1 mm and 1 mm, such as between 0.2 mm and 0.7 mm, such as between 0.2 mm and 0.5 mm, such as about 0.4 mm (millimeters), but not limited thereto.

The first thickness T1 (or the third thickness T3) is, for example, the thickness (e.g., the minimum thickness) of the first region 111 (or the first region 211) of the first substrate 110 (or the second substrate 210) measured along the normal direction Z. The second thickness T2' (or the fourth thickness T4) is, for example, the thickness of the region corresponding to the gate electrode 121 (or the gate electrode 221) in the first substrate 110 (or the second substrate 210) measured along the normal direction Z.

Then, referring to FIG. 2B, after thinning the second surface 110b of the first substrate 110 and thinning the fourth surface 210b of the second substrate 210, the photoresist layer 180 is removed. Next, in a method similar to FIG. 1C and FIG. 1D, the sealing element 150 is removed, the cut first substrate 110' and the cut second substrate 210' are separated and obtained, and the first communication element 160 and the second communication element 260 are respectively disposed on the first substrate 110' and the second substrate 210', so that the first communication element 160 and the second communication element 260 may be respectively electrically connected to the first control element 120 and the second control element 220. So far, the communication device 100a and the communication device 200 of this embodiment are obtained.

In this embodiment, as shown in FIG. 2B, since the thickness of the first region 111 of the first substrate 110' has been thinned, and the first communication element 160 is disposed on the first surface 110a of the first substrate 110' in the first region 111, the attenuation of the high-frequency signal emitted by the first communication element 160 after passing through the first region 111 of the first substrate 110' may be reduce, which may facilitate the high-frequency signal to pass through the first substrate 110'.

In this embodiment, since the thickness of the second region 112 of the first substrate 110' is not thinned, and the first control element 120 is disposed on the first surface 110a of the first substrate 110' in the second region 112, the second region 112 may provide better strength to support the first control element 120.

Based on the above, as shown in the upper figure of FIG. 2B, the communication device 100a of this embodiment may include a first substrate 110' and a first communication element 160. The first substrate 110' includes a first region 111 and a second region 112. The first substrate 110 has a first surface 110a and a second surface 110b opposite to the first surface 110a. The first communication element 160 is disposed on the first surface 110a of the first substrate 110' in the first region 111. The first substrate 110' has a first thickness T1 in the first region 111, the first substrate 110' has a second thickness T2' in the second region 112, and the first thickness T1 is smaller than the second thickness T2'.

According to some embodiments, as shown in FIG. 2B, the first communication element 160 is disposed in the first region 111 of the substrate 110', the first control element 120 is disposed in the second region 112 of the substrate 110', and the first thickness T1 of the substrate 110' in the first region 111 is smaller than the second thickness T2' of the substrate 110' in the second region 112. In this way, the thinning design of the substrate 110' in the first region 111 facilitates the signal transmission of the first communication element 160, and the larger thickness of the substrate 110' in the second region 112 may provide better support for the first control element 120.

FIG. 3A to FIG. 3D are partial cross-sectional views illustrating the process of a manufacturing method of a communication device according to another embodiment. FIG. 3A to FIG. 3D are steps continuing from FIG. 1B and replacing FIG. 1C to FIG. 1D. The same or similar components in the embodiment of FIG. 3A to FIG. 3D and the embodiment of FIG. 1A to FIG. 1D may proceed by adopting the same materials or methods; therefore, the same and similar descriptions in the two embodiments are not repeated hereafter, and the differences between the two embodiments are mainly described.

Specifically, the manufacturing method of the communication devices 100a and 200a of this embodiment further includes the following steps.

Figure 3A:
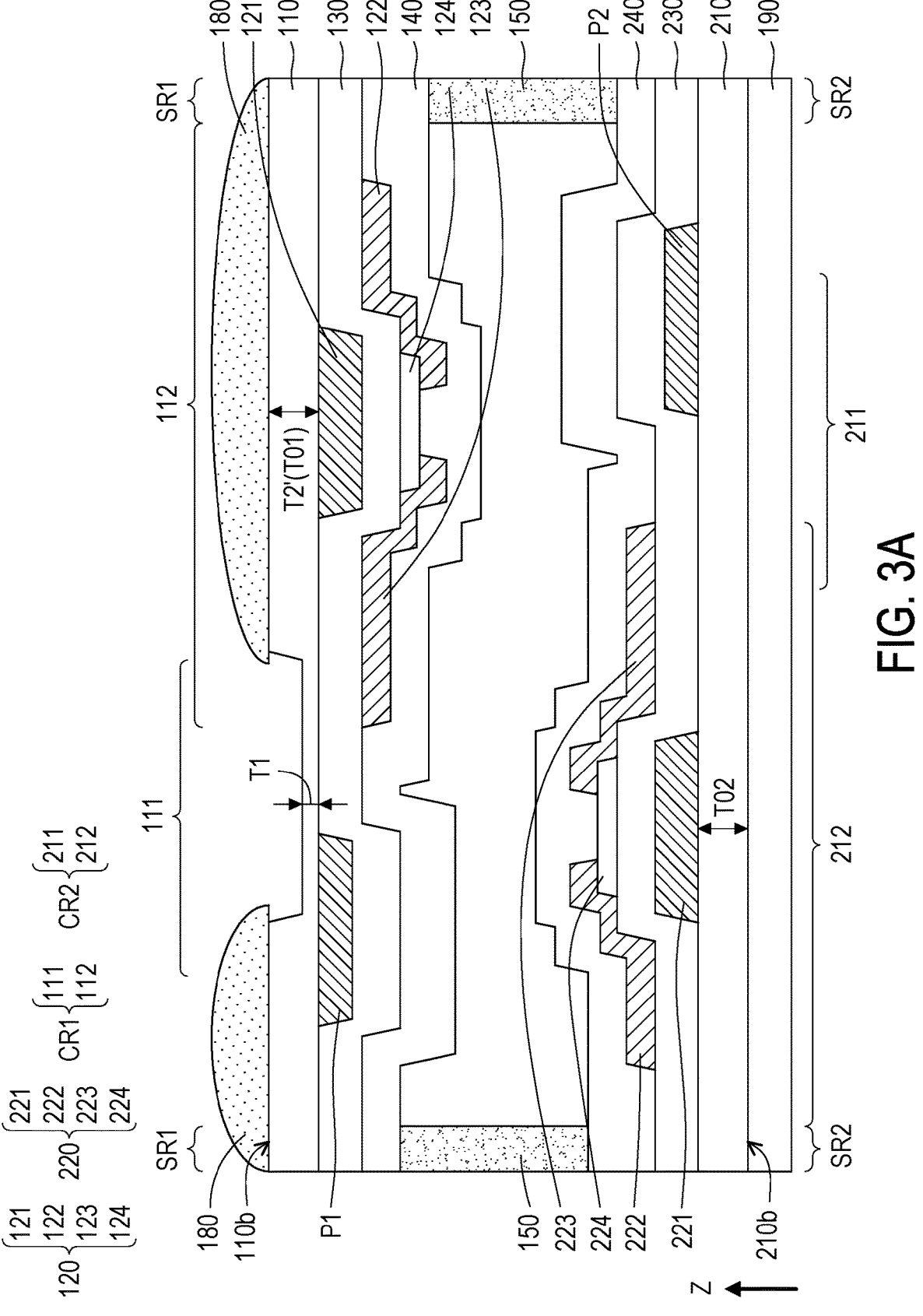
FIG. 3A to FIG. 3D are partial cross-sectional views illustrating the process of a manufacturing method of a communication device according to another embodiment.

Referring to FIG. 3A, after combining the first substrate 110 and the second substrate 210 with the sealing element 150, a photoresist layer 180 is disposed on the second surface 110b of the first substrate 110 in the second region 112, and a protective layer 190 is disposed on the fourth surface 210b of the second substrate 210. Next, the first thinning is performed, for example, with an etching solution. Since the photoresist layer 180 may cover the second region 112 of the first substrate 110 and expose the first region 111 of the first substrate 110, and the protective layer 190 may cover the fourth surface 210b of the second substrate 210, during thinning (e.g., etching), the etching solution etches the first region 111 of the first substrate 110, but does not etch the second region 112 of the first substrate 110 and the second substrate 210. Therefore, after the first thinning, the thickness of the first substrate 110 in the first region 111 may be thinned from the original thickness T01 to T1, which is smaller than T01, the thickness of the first substrate 110 in the second region 112 may be maintained at the original thickness T01, and the second substrate 210 may be maintained at the original thickness T02.

Figure 3B:
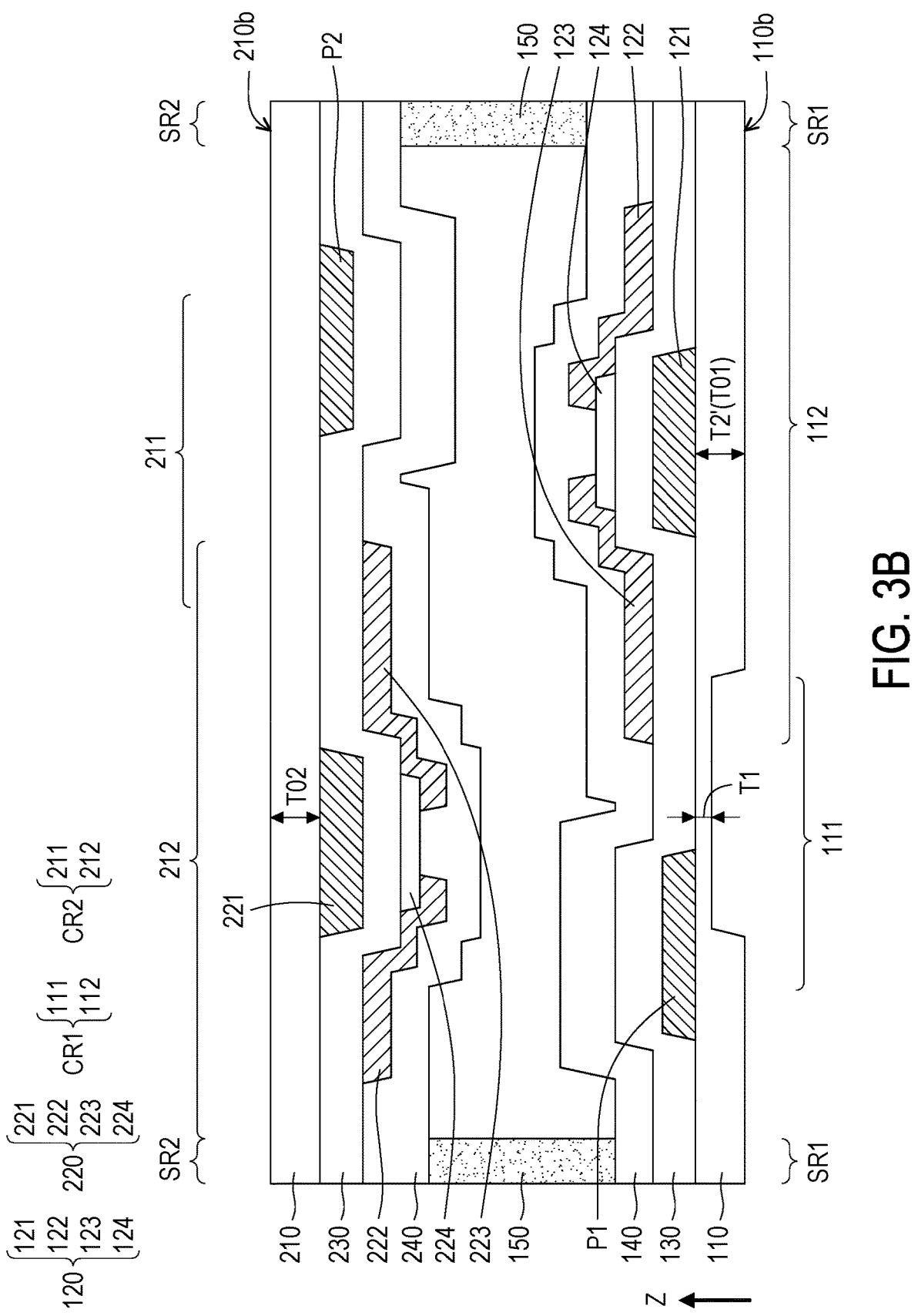

Then, referring to FIG. 3B, after thinning the first region 111 of the first substrate 110, the photoresist layer 180 and the protective layer 190 are removed, and the entire structure (i.e., the combined first substrate 110 and the second substrate 210) is turned upside down.

Figure 3C:
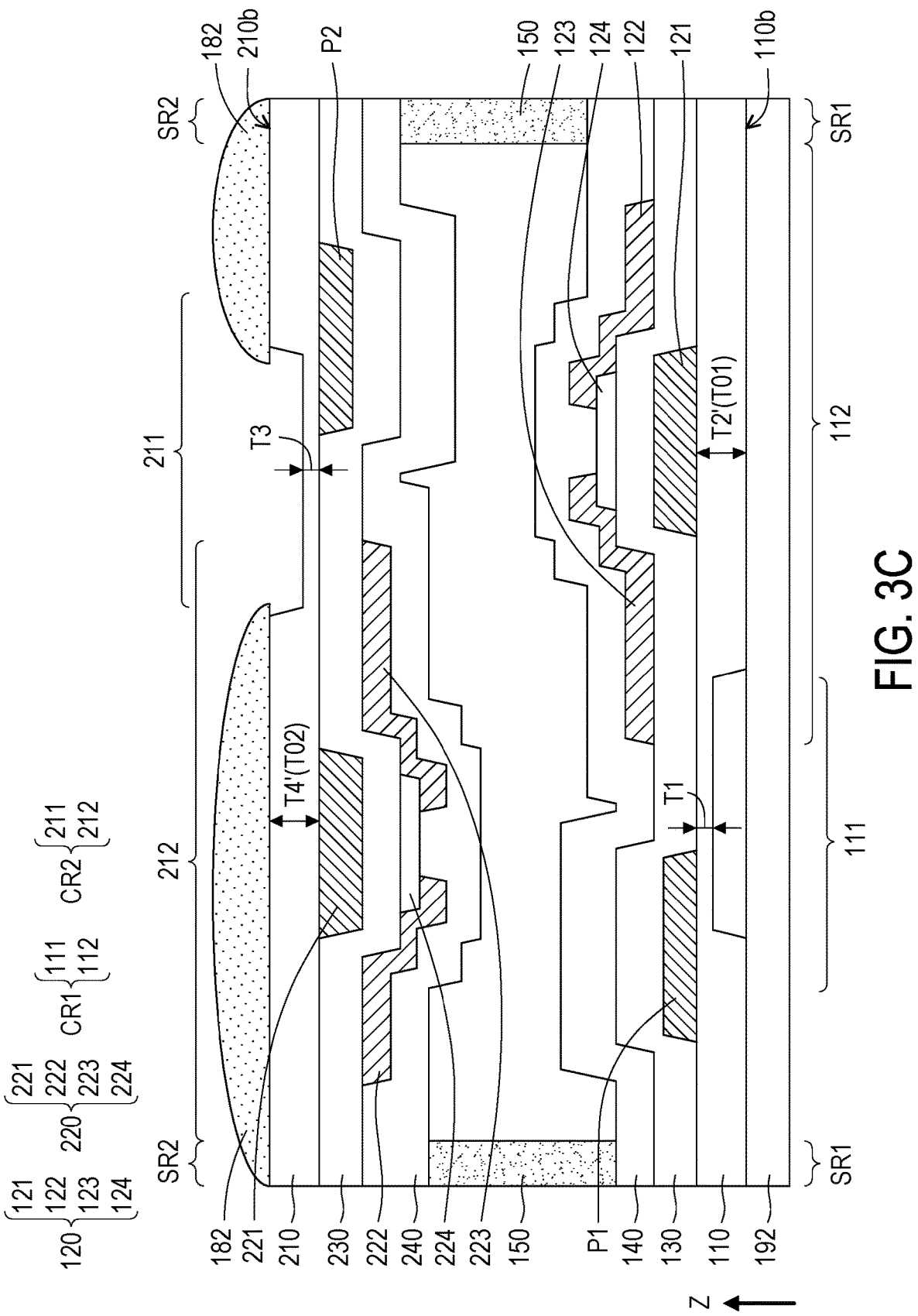

Then, referring to FIG. 3C, a photoresist layer 182 is disposed on the fourth surface 210b of the second substrate 210 in the second region 212, and a protective layer 192 is disposed on the second surface 110b of the first substrate 110. Next, a second thinning is performed. Since the photoresist layer 182 may cover the second region 212 of the second substrate 210 and expose the first region 211 of the second substrate 210, and the protective layer 192 may cover the second surface 110b of the first substrate 110, during thinning (e.g., etching), the etching solution etches the first region 211 of the second substrate 210, but does not etch the second region 212 of the second substrate 210 and the first substrate 110. Therefore, after the second thinning, the thickness of the first substrate 110 may maintain the thickness after the first thinning, that is, the thickness of the first substrate 110 in the first region is T1, and the thickness in the second region is the original thickness T01. The thickness of the second substrate 210 in the first region 211 may be thinned from the original thickness T02 to T3, which is smaller than T02, and the fourth thickness T4' of the second substrate 210 in the second region 212 may be maintained at the original thickness T02.

Figure 3D:
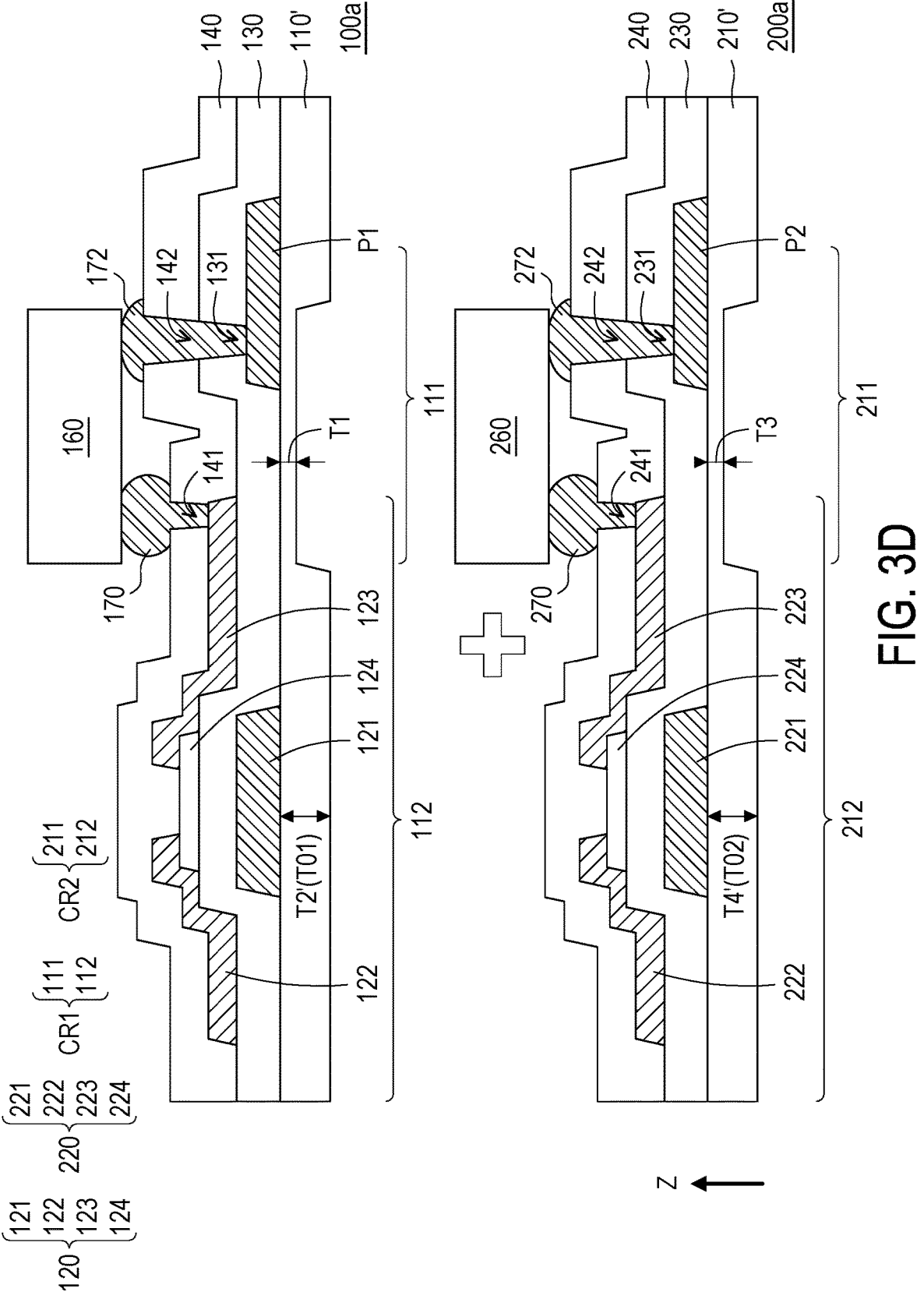

Then, referring to FIG. 3D, after the first region 111 of the first substrate 110 is thinned, for example, after the two thinnings mentioned above are performed, the photoresist layer 182 and the protective layer 192 are removed. Next, in a method similar to FIG. 1C and FIG. 1D, the sealing element 150 is removed, the cut first substrate 110' and the cut second substrate 210' are separated, and the first communication element 160 and the second communication element 260 are respectively disposed on the first substrate 110' and the second substrate 210', details are omitted herein. So far, the communication device 100*a* and the communication device 200*a* of this embodiment have been substantially manufactured.

In this embodiment, since the thickness of the first region 211 of the second substrate 210' has been thinned, and the second communication element 260 is disposed on the third surface 210*a* of the second substrate 210' in the first region 211, the attenuation of the high-frequency signal emitted by the second communication element 260 after passing through the first region 211 of the second substrate 210' may be reduce, which may facilitate the high-frequency signal to pass through the second substrate 210'. Since the thickness of the second substrate 210' in the second region 212 is not thinned (the thickness T02 is maintained), the second control element 220 is disposed in the second region 212 of the second substrate 210', so that the second region 212 may provide better strength to support the second control element 220.

In this embodiment, the material of the protective layer 190 and the protective layer 192 may be acid-resistant materials, such as polymers. Suitable polymers are, for example, polyethylene terephthalate (PET), polyethylene (PE), polyvinyl chloride (PVC), or combinations thereof.

FIG. 4A to FIG. 4D are partial cross-sectional views illustrating the process of a manufacturing method of a communication device according to another embodiment. The embodiments shown in FIG. 4A to FIG. 4D are similar to the embodiments shown in FIG. 1A to FIG. 1D, therefore, the same elements are denoted by the same reference numerals, and the detailed contents thereof are not repeated. The difference between the embodiments shown in FIG. 4A to FIG. 4D and the embodiments shown in FIG. 1A to FIG. 1D is that in the manufacturing method of the communication device 100 of this embodiment, the second control element and the bonding pad are not disposed on the third surface 210*a* of the second substrate 210.

Figure 4A:
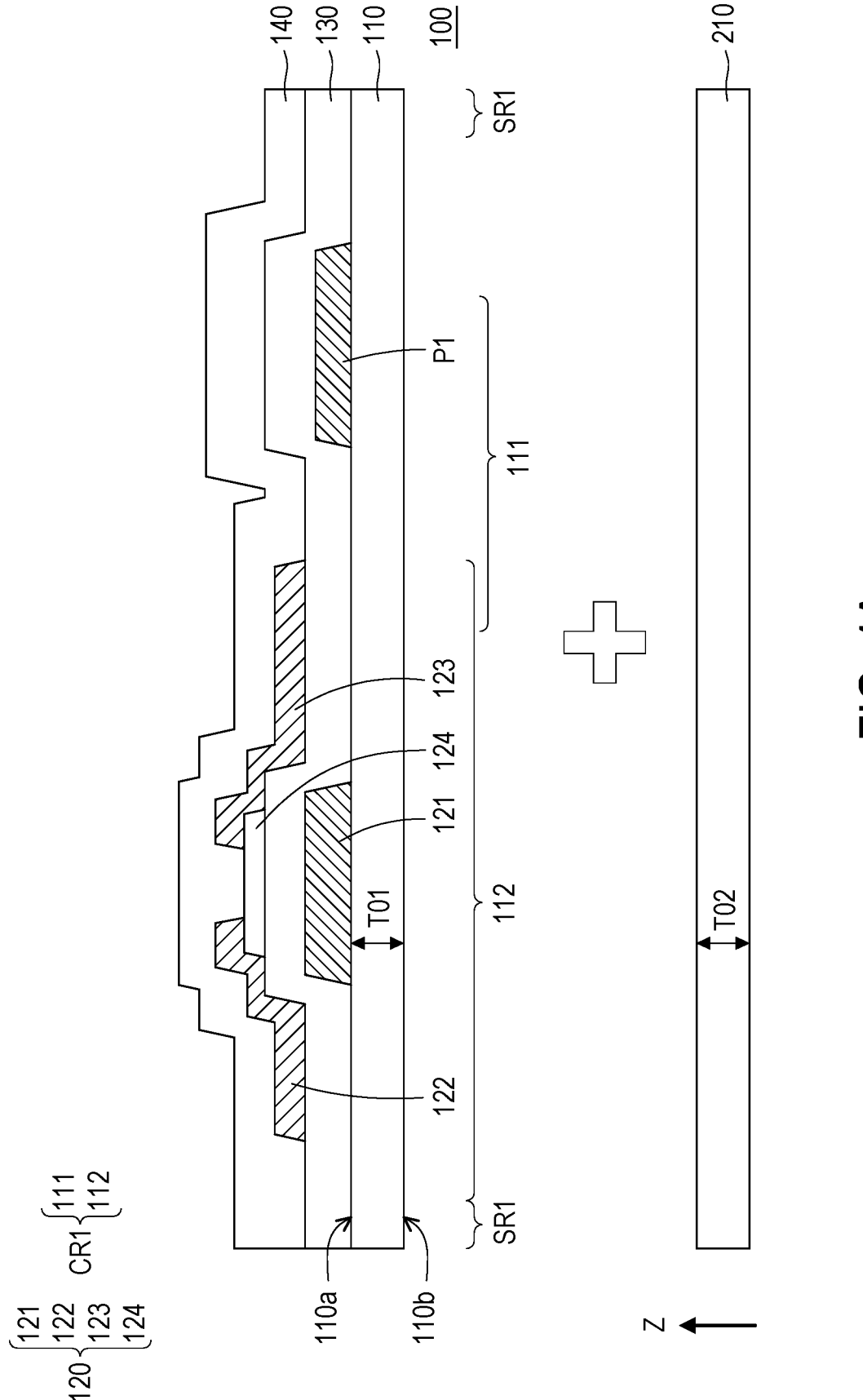
FIG. 4A to FIG. 4D are partial cross-sectional views illustrating the process of a manufacturing method of a communication device according to another embodiment.

Specifically, first, referring to FIG. 4A, in a method similar to FIG. 1A, the first substrate 110 is provided, and the first control element 120 and the bonding pads P1 are disposed on the first surface 110*a* of the first substrate 110 in the second region 112.

Figure 4B:
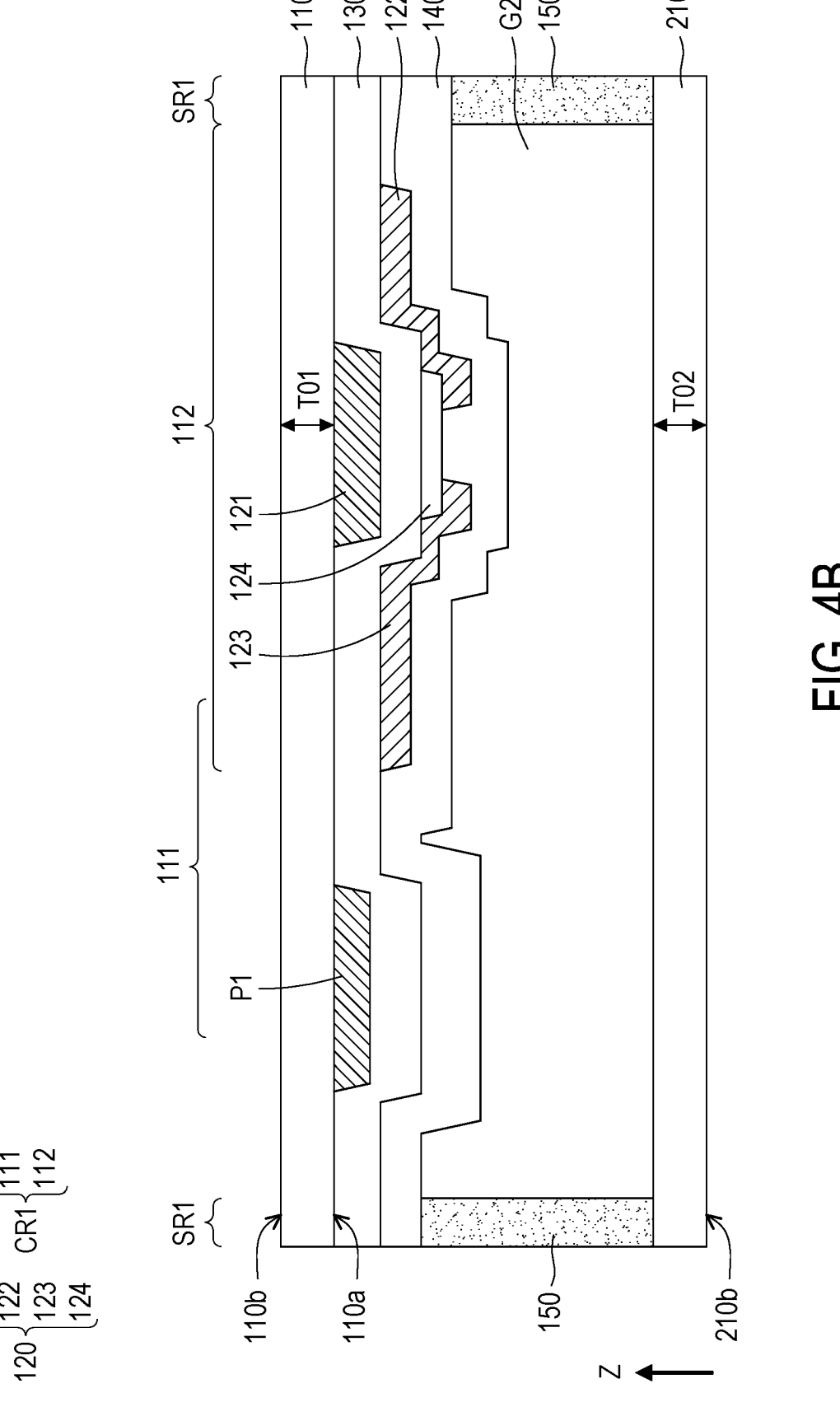

Then, referring to FIG. 4B, the sealing element 150 is coated on the sealing region SR1 of the first substrate 110 and between the insulating layer 140 and the second substrate 210, so that the first substrate 110 and the second substrate 210 may be combined together through the sealing element 150. In this embodiment, the air gap G2 may be surrounded and defined by the insulating layer 140, the sealing element 150, and the second substrate 210.

Figure 4C:
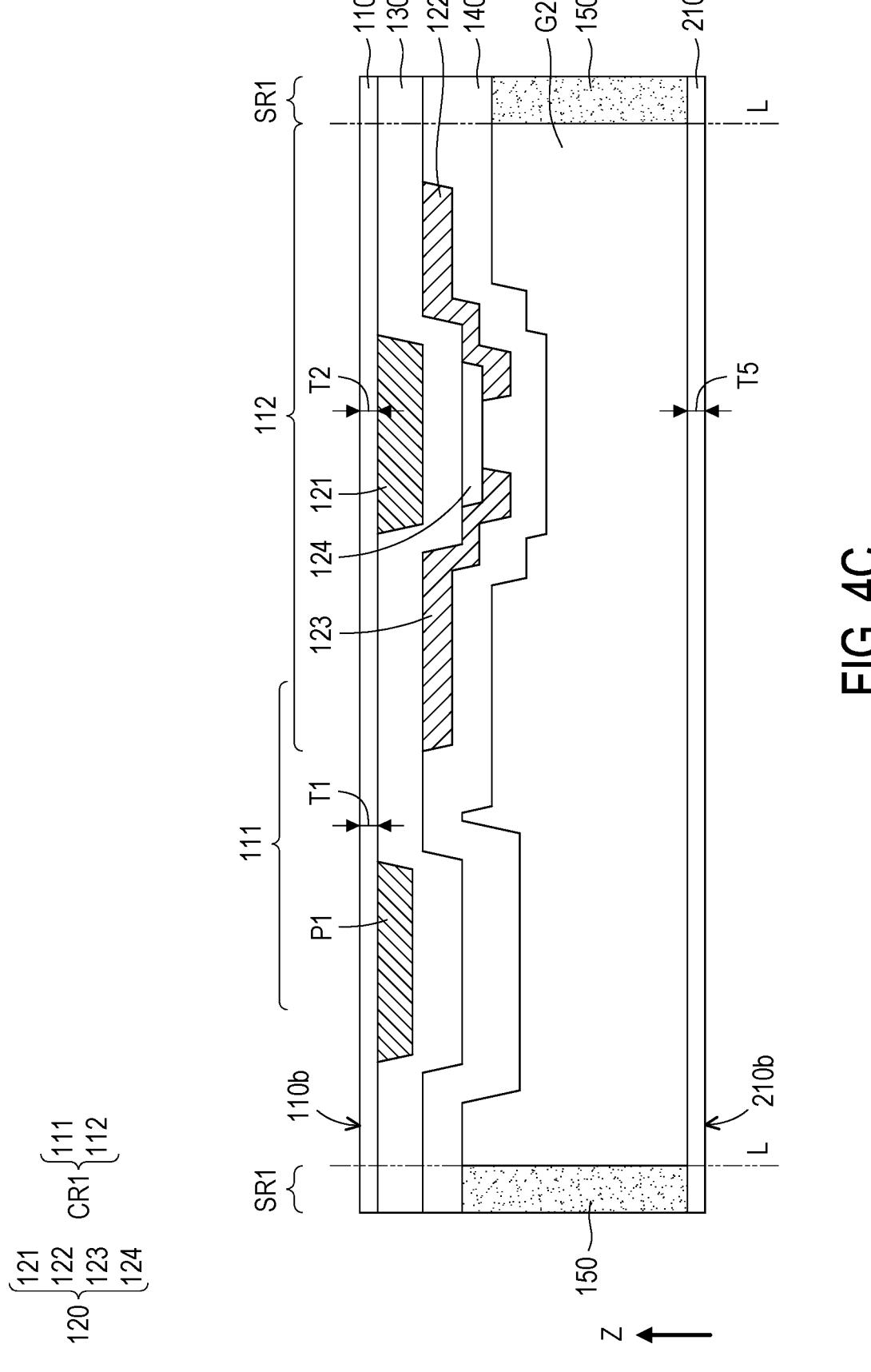

Then, referring to FIG. 4C, in a method similar to FIG. 1C, the second surface 110*b* of the first substrate 110 and the fourth surface 210*b* of the second substrate 210 are thinned by using an etching solution. In this way, after thinning, the thickness of the first substrate 110 may be thinned from the original thickness T01 to T1 and T2. The first thickness T1 may be the thickness of the first substrate 110 in the first region 111, the second thickness T2 may be the thickness of the first substrate 110 in the second region 112, and the first thickness T1 and the second thickness T2 are approximately equal. The first thickness T1 and the second thickness T2 are smaller than the thickness T01. The thickness of the second substrate 210 may be thinned from the original thickness T02 to T5, and the thickness T5 is smaller than the thickness T02.

Figure 4D:
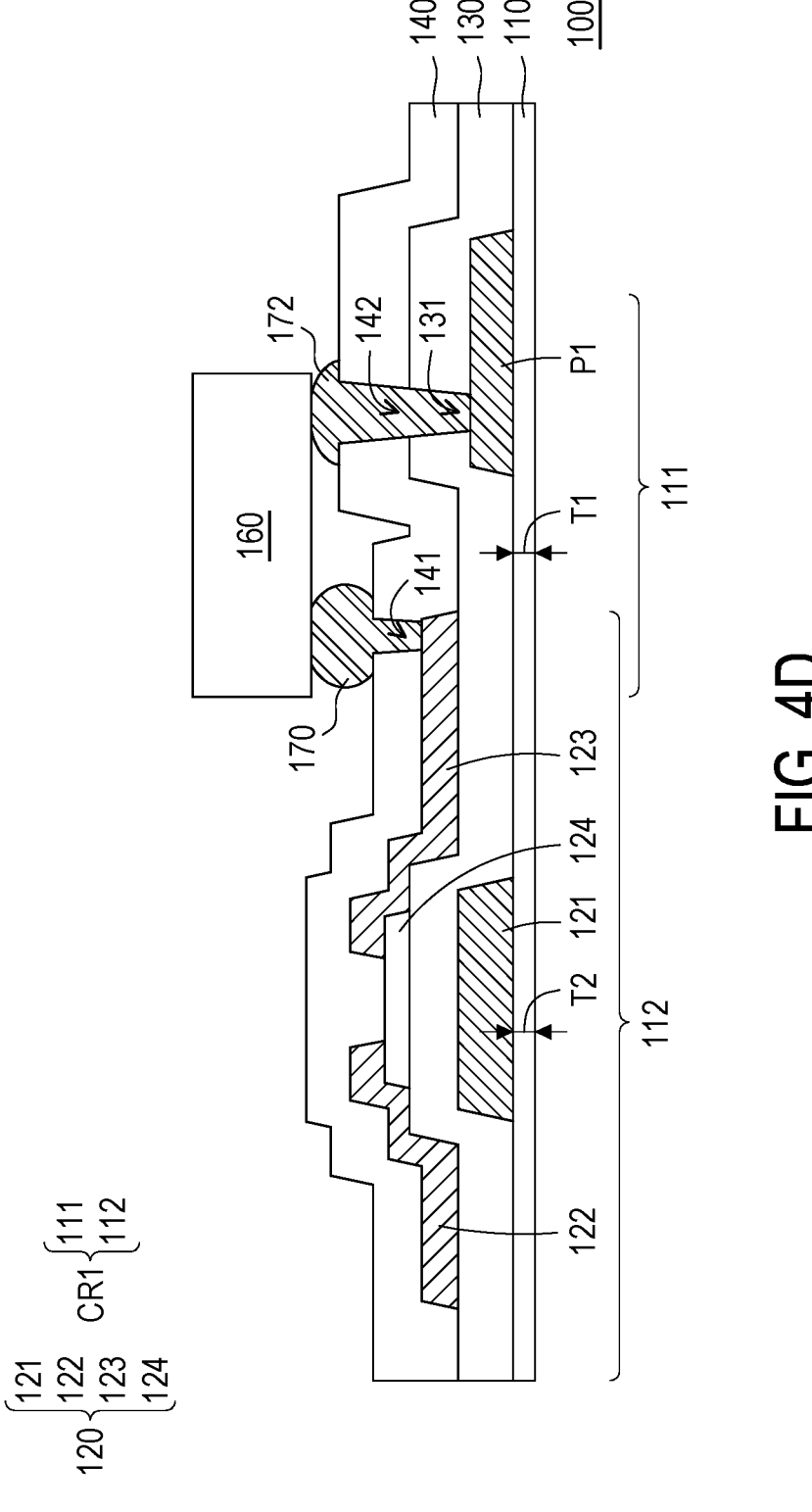

Then, referring to FIG. 4D, in a method similar to FIG. 1C and FIG. 1D, the sealing element 150 is removed, the cut first substrate 110' and the cut second substrate 210' are separated, and the first communication element 160 is disposed on the first surface 110*a* of the first substrate 110' in the first region 111, so that the first communication element 160 may be electrically connected to the first control element 120. So far, the communication device 100 of this embodiment has been substantially manufactured.

Figure 5A:
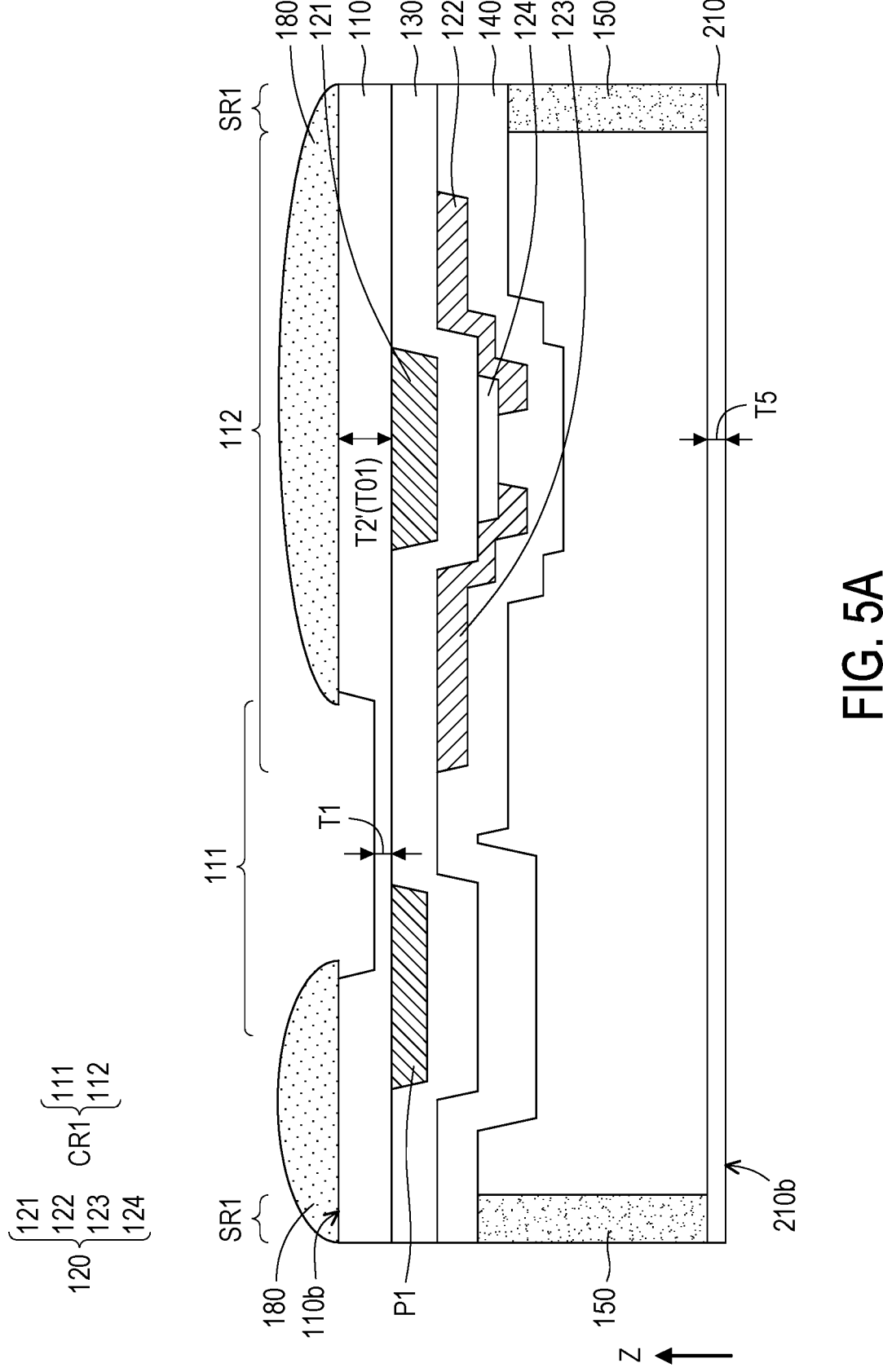
FIG. 5A to FIG. 5B are partial cross-sectional views illustrating the process of a manufacturing method of a communication device according to another embodiment.
Figure 5B:
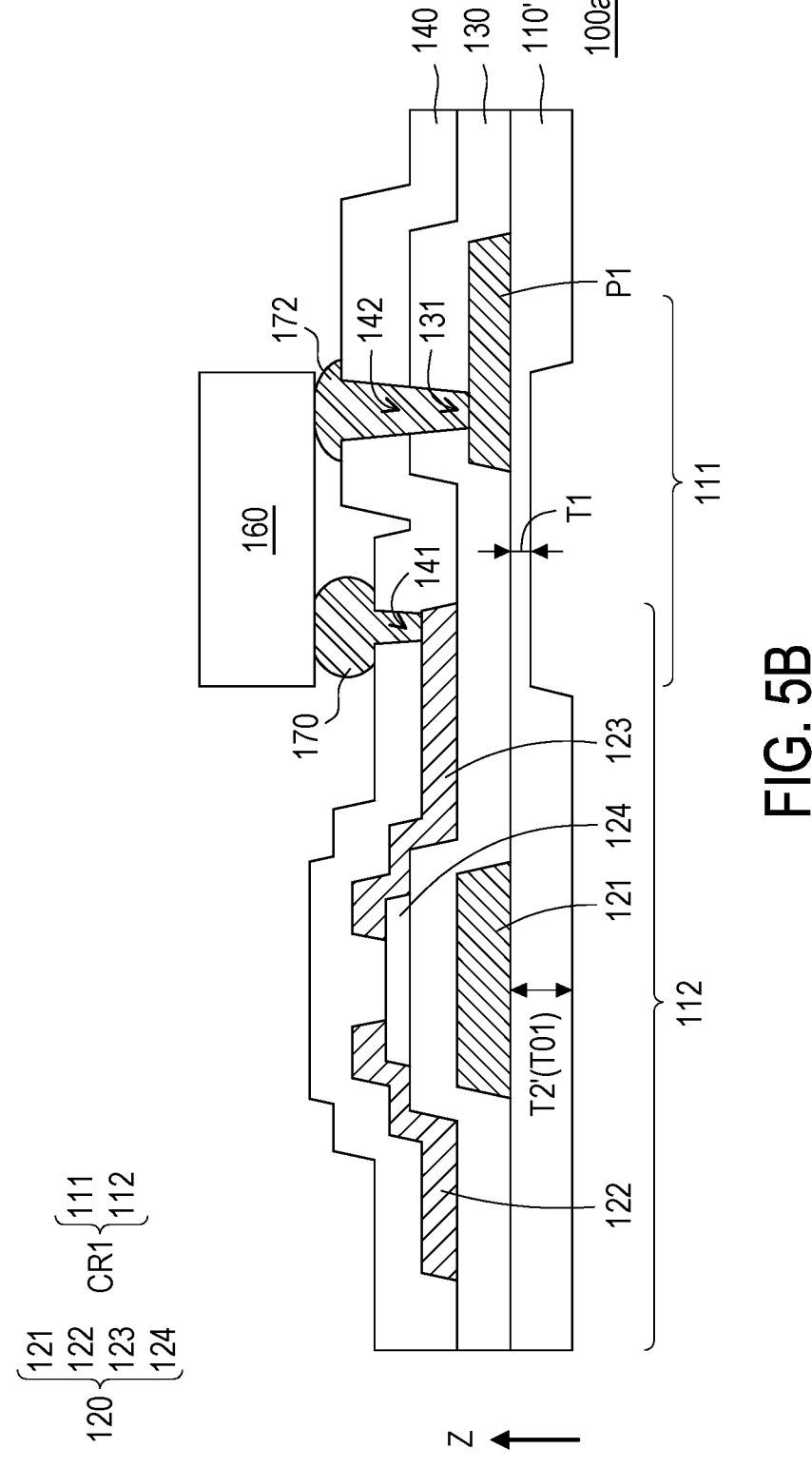

FIG. 5A to FIG. 5B are partial cross-sectional views illustrating the process of a manufacturing method of a communication device according to another embodiment. FIG. 5A to FIG. 5B are steps continuing from FIG. 4B and replacing FIG. 4C to FIG. 4D. The same or similar components in the embodiment of FIG. 5A to FIG. 5B and the embodiment of FIG. 4A to FIG. 4D may proceed by adopting the same materials or methods; therefore, the same and similar descriptions in the two embodiments are not repeated hereafter, and the differences between the two embodiments are mainly described.

Specifically, first, referring to FIG. 5A, in a method similar to FIG. 2A, after the first substrate 110 and the second substrate 210 are combined with the sealing element 150 and before the second surface 110*b* of the first substrate 110 is thinned, the photoresist layer 180 is firstly disposed on the second surface 110*b* of the first substrate 110 in the second region 112. Next, thinning is performed, for example, the second surface 110*b* of the first substrate 110 and the fourth surface 210*b* of the second substrate 210 are thinned with an etching solution, so that the first thickness T1 of the first region 111 of the first substrate 110 may be smaller than the second thickness T2' of the second region 112 of the first substrate 110. The thickness of the second substrate 210 may be thinned from the aforementioned original thickness T02 to T5, and the thickness T5 is smaller than the thickness T02.

Then, referring to FIG. 5B, in a method similar to FIG. 2B, the sealing element 150 is removed, the cut first substrate 110' and the cut second substrate 210' are separated, and the first communication element 160 is disposed on the first surface 110*a* of the first substrate 110' in the first region 111, so that the first communication element 160 may be electrically connected to the first control element 120. So far, the communication device 100*a* of this embodiment has been substantially manufactured. The functions that may be achieved by the communication device 100*a* are as described in the previous embodiments, and are not be repeated herein.

To sum up, in the manufacturing method of a communication device according to an embodiment of the disclosure, after the first substrate and the second substrate are combined with the sealing element, by means of thinning the first substrate and/or the second substrate, the signal transmission of the communication element can be facilitated. According to some embodiments, the communication element is disposed in the first region of the substrate, the control element is disposed in the second region of the substrate, and the thickness of the substrate in the first region is smaller than the thickness of the substrate in the second region. In this way, the thinning design of the substrate in the first region can facilitate the signal transmission of the communication element, and the larger thickness of the substrate in the second region may provide better support for the control element.

Finally, it should be noted that the foregoing embodiments are only used to illustrate the technical solutions of the disclosure, but not to limit the disclosure; although the disclosure has been described in detail with reference to the foregoing embodiments, persons of ordinary skill in the art should understand that the technical solutions described in the foregoing embodiments can still be modified, or parts or all of the technical features thereof can be equivalently replaced; however, these modifications or substitutions do not deviate the essence of the corresponding technical solutions from the scope of the technical solutions of the embodiments of the disclosure.

What is claimed is:

1. A manufacturing method of a communication device, comprising:

providing a first dielectric layer, wherein the first dielectric layer comprises a first region and a second region, and the first dielectric layer has a first surface and a second surface opposite to the first surface;

providing a second dielectric layer;

combining the first dielectric layer and the second dielectric layer with a sealing element, so that the sealing element is disposed between the first surface of the first dielectric layer and a third surface of the second dielectric layer, and an air gap is formed between the first dielectric layer and the second dielectric layer, and the air gap is surrounded and defined by the first dielectric layer, the second dielectric layer and the sealing element;

before combining the first dielectric layer and the second dielectric layer, disposing a first control element on the first surface of the first dielectric layer in the second region, and disposing a bonding pad on the first surface of the first dielectric layer in the first region;

after combining the first dielectric layer and the second dielectric layer, thinning the second surface of the first dielectric layer; and disposing a first communication element on the first surface of the first dielectric layer in the first region.

2. The manufacturing method of the communication device according to claim 1, wherein the first dielectric layer is a first substrate, and the second dielectric layer is a second substrate.

3. The manufacturing method of the communication device according to claim 2, further comprising:

after thinning, removing the sealing element, to separate the first substrate and the second substrate;

after separating the first substrate and the second substrate, disposing the first communication element on the first surface in the first region of the first substrate that is separated; and electrically connecting the first communication element with the first control element.

4. The manufacturing method of the communication device according to claim 2, further comprising:

before the step of combining the first substrate and the second substrate, performing the step of disposing the first communication element; and electrically connecting the first communication element with the first control element.

5. The manufacturing method of the communication device according to claim 2, further comprising:

disposing a second communication element on the third surface of the second substrate.

6. The manufacturing method of the communication device according to claim 5, further comprising:

before combining the first substrate and the second substrate, disposing a second control element on the third surface of the second substrate;

after thinning, removing the sealing element, to separate the first substrate and the second substrate;

after separating the first substrate and the second substrate, disposing the second communication element on the third surface of the second substrate that is separated; and electrically connecting the second communication element with the second control element.

7. The manufacturing method of the communication device according to claim 5, further comprising:

before combining the first substrate and the second substrate, disposing the second communication element and a second control element on the third surface of the second substrate; and electrically connecting the second communication element with the second control element.

8. The manufacturing method of the communication device according to claim 2, further comprising:

after combining the first substrate and the second substrate, and before thinning the second surface of the first substrate, disposing a photoresist layer on at least a portion of the second surface of the first substrate in the second region; and after thinning the second surface of the first substrate, removing the photoresist layer, wherein, after thinning the second surface of the first substrate, the first substrate has a first thickness in the first region, the first substrate has a second thickness in the second region, and the first thickness is smaller than the second thickness.

9. The manufacturing method of the communication device according to claim 1, wherein the first communication element is a varactor.

10. The manufacturing method of the communication device according to claim 1, wherein the first dielectric layer and the second dielectric layer have the same material.

11. The manufacturing method of the communication device according to claim 1, wherein the first dielectric layer and the second dielectric layer have different materials.

* * * * *